US011587976B2

(12) United States Patent
Finck et al.

(10) Patent No.: US 11,587,976 B2
(45) Date of Patent: Feb. 21, 2023

(54) QUANTUM DEVICE FACILITATING SUPPRESSION OF ZZ INTERACTIONS BETWEEN TWO-JUNCTION SUPERCONDUCTING QUBITS

(71) Applicant: International Business Machines Corporation, Armonk, NY (US)

(72) Inventors: Aaron Finck, White Plains, NY (US); April Carniol, Ossining, NY (US); John Blair, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 189 days.

(21) Appl. No.: 16/917,056

(22) Filed: Jun. 30, 2020

(65) Prior Publication Data
US 2021/0408113 A1    Dec. 30, 2021

(51) Int. Cl.
*H01L 39/02*    (2006.01)
*H01L 27/18*    (2006.01)
(Continued)

(52) U.S. Cl.
CPC .............. *H01L 27/18* (2013.01); *G06N 10/00* (2019.01); *H01L 39/025* (2013.01); *H01L 39/223* (2013.01); *H01P 3/003* (2013.01)

(58) Field of Classification Search
CPC ..... H01L 27/18; H01L 39/025; H01L 39/223; H01L 39/00–2496; G06N 10/00;
(Continued)

(56) References Cited

U.S. PATENT DOCUMENTS 6,900,456 B2    5/2005 Blais et al.
9,892,365 B2 *  2/2018 Rigetti ................... G06N 10/00
(Continued)

FOREIGN PATENT DOCUMENTS

EP    3300004 A1 *  3/2018  .......... G06F 11/1076

OTHER PUBLICATIONS

International Search Report and Written Opinion for International Application No. PCT/EP2021/067861 dated Oct. 22, 2021, 16 pages.
(Continued)

*Primary Examiner* — Shahed Ahmed
(74) *Attorney, Agent, or Firm* — Amin, Turocy & Watson, LLP

(57) ABSTRACT

Devices and/or computer-implemented methods facilitating static ZZ suppression and Purcell loss reduction using mode-selective coupling in two-junction superconducting qubits are provided. In an embodiment, a device can comprise a superconducting bus resonator. The device can further comprise a first superconducting qubit. The device can further comprise a second superconducting qubit, the first superconducting qubit and the second superconducting qubit respectively comprising: a first superconducting pad; a second superconducting pad; a third superconducting pad; a first Josephson Junction coupled to the first superconducting pad and the second superconducting pad; and a second Josephson Junction coupled to the second superconducting pad and the third superconducting pad. The first superconducting pad and the second superconducting pad of the first superconducting qubit and the second superconducting qubit are coupled to the superconducting bus resonator. The superconducting bus resonator entangles the first superconducting qubit and the second superconducting qubit based on receiving a control signal.

10 Claims, 10 Drawing Sheets

(51) Int. Cl.
*G06N 10/00* (2022.01)
*H01L 39/22* (2006.01)
*H01P 3/00* (2006.01)

(58) Field of Classification Search
CPC ........ G06N 10/40; G06N 10/70; G06N 10/20; H03K 19/017545; H03K 19/195; H01P 3/003
See application file for complete search history.

(56) References Cited

U.S. PATENT DOCUMENTS

| | | | |
|---|---|---|---|
| 10,074,792 B1* | 9/2018 | Ferguson | G06N 10/00 |
| 10,347,605 B2 | 7/2019 | Sandberg et al. | |
| 10,353,844 B2 | 7/2019 | Naaman et al. | |
| 10,622,998 B1* | 4/2020 | Najafi-Yazdi | H01L 39/025 |
| 2017/0193388 A1* | 7/2017 | Filipp | G06F 15/82 |
| 2018/0225586 A1 | 8/2018 | Chow et al. | |
| 2018/0226451 A1 | 8/2018 | Dzurak et al. | |
| 2018/0240034 A1* | 8/2018 | Harris | G06N 10/20 |
| 2019/0385673 A1 | 12/2019 | Bosman et al. | |
| 2020/0162078 A1* | 5/2020 | Mckay | H01P 7/00 |

OTHER PUBLICATIONS

Hazra Sumeru et al: "Engineering cross resonance interaction in multi-modal quantum circuits," Applied Physics Letters, vol. 116, No. 15, Apr. 13, 2020 (Apr. 13, 2020), p. 152601, XP055850060, US ISSN: 0003-6951, DOI: 10.1063/1.5143440, abstract, p. 1-p. 4, p. S1-p. S2; figure 1.

Ku Jaseung et al: "Suppression of Unwanted ZZ Interactions in a Hybrid Two-Qubit System," Physical review letters, Apr. 9, 2020 (Apr. 9, 2020), pp. 200504-200504, XP055849306, DOI: 10.1103/PhysRevLett.125.200504, Retrieved from the Internet: URL:https://arxiv.org/pdf/2003.02775.pdf, [retrieved on Oct. 8, 2021] the whole document.

Zhao Peng et al: "High-contrast ZZ interaction using multi-type superconducting qubits," Feb. 19, 2020 (Feb. 19, 2020), XP055849495, Retrieved from the Internet: URL:https://arxiv.org/pdf/2002.07560v2.pdf [retrieved on Oct. 8, 2021] the whole document.

Gambetta et al., "A superconducting qubit with Purcell protection and tunable coupling," Phys Rev Lett 106, 030502, arXiv:1009.4470v1 [cond-mat.mes-hall], Oct. 22, 2018, 4 pages.

Srinivasan et al., "Tunable coupling in circuit quantum electrodynamics with a superconducting V-system," Phys Rev Lett 106, 083601, arXiv:1011.4317v1 [cond-mat.supr-con], Nov. 18, 2010, 5 pages.

Cross et al., "Optimized pulse shapes for a resonator-induced phase gate," Phys Rev A 91, 032325, arXiv:1411.5436v2 [quant-ph], Nov. 11, 2014, 13 pages.

Rebic et al., "Giant-Kerr nonlinearities in Circuit-QED," Phys Rev Lett 103, 150503, arXiv0902.0402v2 [quant-ph], Oct. 9, 2009, 4 pages.

Roy et al., "Implementation of pairwise longitudinal coupling in a three-qubit superconducting circuit," Phys Rev Applied 7, 054025, arXiv: 1610.07915v1 [quant-ph], Oct. 26, 2016, 16 pages.

Paik et al., "Experimental demonstration of a resonator-induced phase gate in a multi-qubit circuit QED system," Phys Rev Lett 117, 250502, arXiv:1606.00685v1 [quant-ph], Jun. 3, 2016, 13 pages.

* cited by examiner

QUANTUM DEVICE FACILITATING SUPPRESSION OF ZZ INTERACTIONS BETWEEN TWO-JUNCTION SUPERCONDUCTING QUBITS

BACKGROUND

The subject disclosure relates to a quantum device, and more specifically, to a quantum device facilitating suppression of ZZ interactions between two-junction superconducting quantum bits (qubits).

Qubits coupled via a bus have residual interactions with each other, even in the absence of external drives (e.g., external microwave pulses, magnetic fields, etc.). These residual interactions, known as ZZ interactions, can cause a qubit's frequency to be dependent on the state of its neighbors and can inhibit the fidelity of quantum operations. Furthermore, coupling a qubit to a bus can contribute to energy loss and decoherence, either through internal losses in the bus (e.g. surface loss or two-level systems) or through external loss of energy to the outside world via the bus's drive port.

Some prior art technologies use a two-junction qubit to enable tunable coupling to a readout resonator and as a method to encode multiple qubits within a single circuit. A problem with such prior art technologies is that they do not use mode-selective coupling in multi-mode qubits to suppress static ZZ interactions between data modes while enabling purely longitudinal coupling to the bus resonator.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate static ZZ suppression and Purcell loss reduction using mode-selective coupling in two-junction superconducting qubits are described.

According to an embodiment, a device can comprise a superconducting bus resonator. The device can further comprise a first superconducting qubit. The device can further comprise a second superconducting qubit, the first superconducting qubit and the second superconducting qubit respectively comprising: a first superconducting pad; a second superconducting pad; a third superconducting pad; a first Josephson Junction coupled to the first superconducting pad and the second superconducting pad; and a second Josephson Junction coupled to the second superconducting pad and the third superconducting pad. The first superconducting pad and the second superconducting pad of the first superconducting qubit and the second superconducting qubit are coupled to the superconducting bus resonator. The superconducting bus resonator entangles the first superconducting qubit and the second superconducting qubit based on receiving a control signal. An advantage of such a device is that it can suppress ZZ interactions between a first oscillating mode of both the first superconducting qubit and the second superconducting qubit and/or improve the speed of a quantum gate (e.g., an entangling quantum gate) comprising such qubits.

In some embodiments, the first superconducting pad and the second superconducting pad of the first superconducting qubit and the second superconducting qubit are coupled to the superconducting bus resonator to suppress ZZ interactions between the first superconducting qubit and the second superconducting qubit and to reduce energy loss associated with the superconducting bus resonator, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the device. An advantage of such a device is that it can enable development of a logical qubit and/or a scalable quantum computer.

According to another embodiment, a computer-implemented method can comprise encoding, by a system operatively coupled to a processor, quantum information in a first oscillating mode of a first superconducting qubit and a second superconducting qubit. The computer-implemented method can further comprise coupling, by the system, a superconducting bus resonator to an oscillating mode structure corresponding to a second oscillating mode of the first superconducting qubit and the second superconducting qubit. An advantage of such a computer-implemented method is that it can be implemented to suppress ZZ interactions between a first oscillating mode of both the first superconducting qubit and the second superconducting qubit and/or improve the speed of a quantum gate (e.g., an entangling quantum gate) comprising such qubits.

In some embodiments, the above computer-implemented method can further comprise encoding, by the system, the quantum information in the first oscillating mode of the first superconducting qubit and the second superconducting qubit; and coupling, by the system, the superconducting bus resonator to the oscillating mode structure corresponding to the second oscillating mode of the first superconducting qubit and the second superconducting qubit to suppress ZZ interactions between the first superconducting qubit and the second superconducting qubit and to reduce energy loss associated with the superconducting bus resonator, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the first superconducting qubit, the second superconducting qubit, and the superconducting bus resonator. An advantage of such a computer-implemented method is that it can be implemented to enable development of a logical qubit and/or a scalable quantum computer.

According to another embodiment, a device can comprise a superconducting bus resonator. The device can further comprise a first superconducting qubit. The device can further comprise a second superconducting qubit, the first superconducting qubit and the second superconducting qubit respectively comprising: a first superconducting pad; a second superconducting pad; a third superconducting pad; a first Josephson Junction coupled to the first superconducting pad and the second superconducting pad; and a second Josephson Junction coupled to the second superconducting pad and the third superconducting pad. The second superconducting pad of the first superconducting qubit and the second superconducting qubit is coupled to the superconducting bus resonator. The superconducting bus resonator entangles the first superconducting qubit and the second superconducting qubit based on receiving a control signal. An advantage of such a device is that it can suppress ZZ interactions between a first oscillating mode of both the first superconducting qubit and the second superconducting qubit and/or improve the speed of a quantum gate (e.g., an entangling quantum gate) comprising such qubits.

In some embodiments, the second superconducting pad of the first superconducting qubit and the second superconducting pad of the second superconducting qubit are coupled to the superconducting bus resonator to suppress ZZ interactions between the first superconducting qubit and the second superconducting qubit and to reduce energy loss associated with the superconducting bus resonator, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the device. An advantage of such a device is that it can enable development of a logical qubit and/or a scalable quantum computer.

According to another embodiment, a computer-implemented method can comprise encoding, by a system operatively coupled to a processor, quantum information in a data mode of a first superconducting qubit and a second superconducting qubit. The computer-implemented method can further comprise coupling, by the system, a superconducting bus resonator to a coupling mode structure corresponding to a coupling mode of the first superconducting qubit and the second superconducting qubit. An advantage of such a computer-implemented method is that it can be implemented to suppress ZZ interactions between a first oscillating mode of both the first superconducting qubit and the second superconducting qubit and/or improve the speed of a quantum gate (e.g., an entangling quantum gate) comprising such qubits.

In some embodiments, the above computer-implemented method can further comprise encoding, by the system, the quantum information in the data mode of the first superconducting qubit and the second superconducting qubit; and coupling, by the system, the superconducting bus resonator to the coupling mode structure corresponding to the coupling mode of the first superconducting qubit and the second superconducting qubit to suppress ZZ interactions between the first superconducting qubit and the second superconducting qubit and to reduce energy loss associated with the superconducting bus resonator, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the first superconducting qubit, the second superconducting qubit, and the superconducting bus resonator. An advantage of such a computer-implemented method is that it can be implemented to enable development of a logical qubit and/or a scalable quantum computer.

According to another embodiment, a device can comprise a first superconducting qubit and a second superconducting qubit that operate in a first oscillating mode. The device can further comprise a superconducting bus resonator coupled to an oscillating mode structure corresponding to a second oscillating mode of the first superconducting qubit and the second superconducting qubit. An advantage of such a device is that it can suppress ZZ interactions between a first oscillating mode of both the first superconducting qubit and the second superconducting qubit and/or improve the speed of a quantum gate (e.g., an entangling quantum gate) comprising such qubits.

In some embodiments, the first superconducting qubit and the second superconducting qubit operate in the first oscillating mode and the superconducting bus resonator is coupled to the oscillating mode structure corresponding to the second oscillating mode to suppress ZZ interactions between the first superconducting qubit and the second superconducting qubit and to reduce energy loss associated with the superconducting bus resonator, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the device. An advantage of such a device is that it can enable development of a logical qubit and/or a scalable quantum computer.

DETAILED DESCRIPTION

Figure 1A:
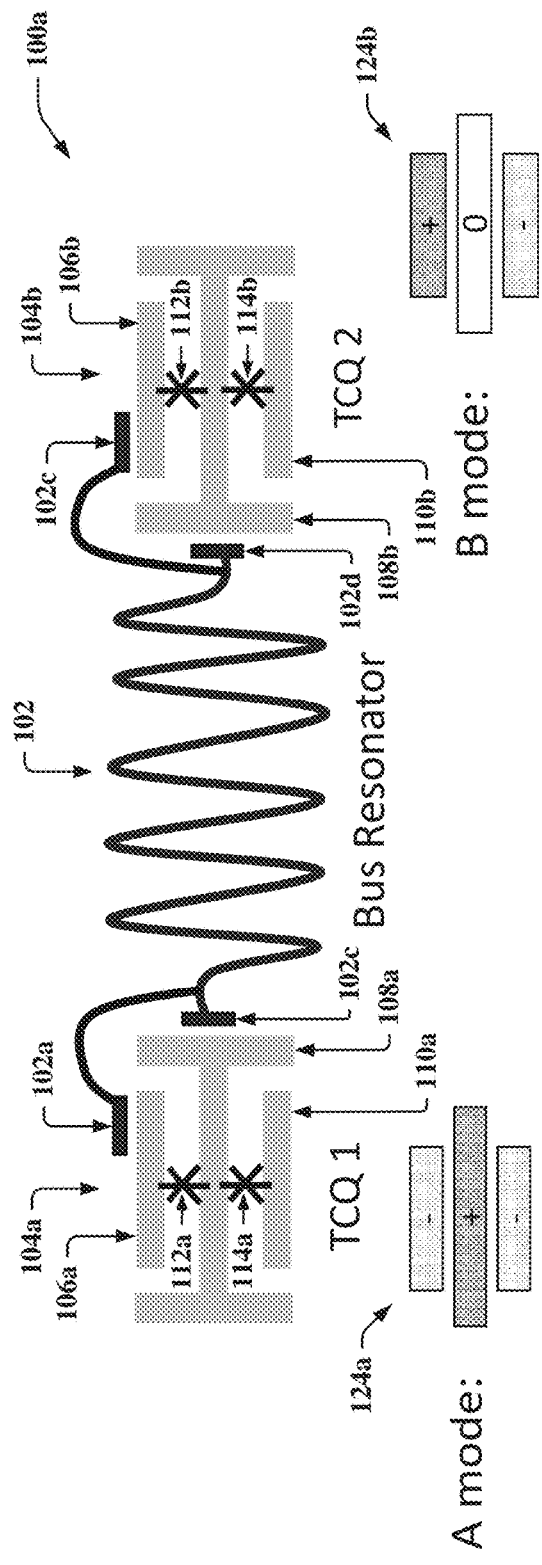
FIG. 1A illustrates a top view of an example, non-limiting device that can facilitate static ZZ suppression and Purcell loss reduction using mode-selective coupling in two-junction superconducting qubits in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, can entangle multiple quantum bits, and use interference.

Given the problems described above with prior art technologies, the present disclosure can be implemented to produce a solution to these problems in the form of devices and/or computer-implemented methods that can facilitate static ZZ suppression and Purcell loss reduction using mode-selective coupling in two-junction superconducting qubits by employing a device comprising a superconducting bus resonator, a first superconducting qubit, and a second superconducting qubit, the first superconducting qubit and the second superconducting qubit respectively comprising: a first superconducting pad; a second superconducting pad; a third superconducting pad; a first Josephson Junction coupled to the first superconducting pad and the second superconducting pad; and a second Josephson Junction coupled to the second superconducting pad and the third superconducting pad, where the first superconducting pad and the second superconducting pad of the first superconducting qubit and the second superconducting qubit are coupled to the superconducting bus resonator, and where the superconducting bus resonator entangles the first superconducting qubit and the second superconducting qubit based on receiving a control signal. An advantage of such devices and/or computer-implemented methods is that they can be implemented to suppress ZZ interactions between a first oscillating mode of both the first superconducting qubit and the second superconducting qubit and/or improve the speed of a quantum gate (e.g., an entangling quantum gate) comprising such qubits.

In some embodiments, the present disclosure can be implemented to produce a solution to the problems described above in the form of devices and/or computer-implemented methods where the first superconducting pad and the second superconducting pad of the first superconducting qubit and the second superconducting qubit are coupled to the superconducting bus resonator to suppress ZZ interactions between the first superconducting qubit and the second superconducting qubit and to reduce energy loss associated with the superconducting bus resonator, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the device. An advantage of such devices and/or computer-implemented methods is that they can be implemented to enable development of a logical qubit and/or a scalable quantum computer.

Figure 1B:
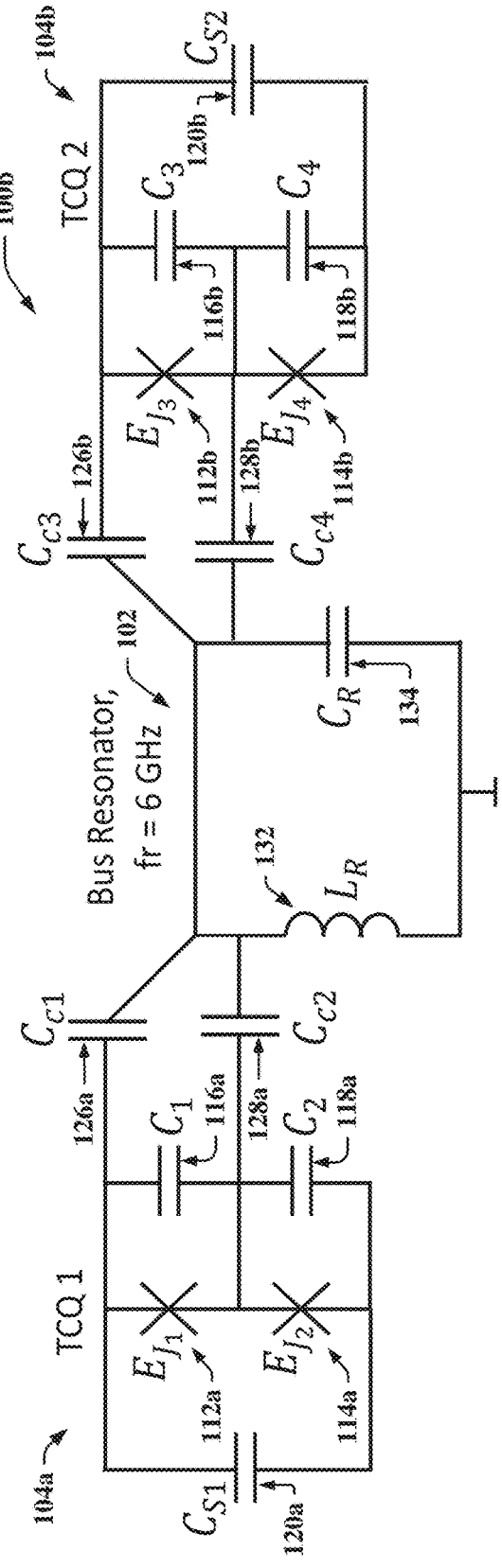
FIG. 1B illustrates an example, non-limiting circuit schematic of the device of FIG. 1A.

It will be understood that when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling. It will also be understood that the following terms referenced herein are be defined as follows:

FIG. 1A illustrates a top view of an example, non-limiting device 100a that can facilitate static ZZ suppression and Purcell loss reduction using mode-selective coupling in two-junction superconducting qubits in accordance with one or more embodiments described herein. FIG. 1B illustrates an example, non-limiting circuit schematic 100b of device 100a.

Device 100a can comprise a semiconducting and/or a superconducting device that can be implemented in a quantum device. For example, device 100a can comprise an integrated semiconducting and/or superconducting circuit (e.g., a quantum circuit) that can be implemented in a quantum device such as, for instance, quantum hardware, a quantum processor, a quantum computer, and/or another quantum device. Device 100a can comprise a semiconducting and/or a superconducting device such as, for instance, a quantum coupler device that can be implemented in such a quantum device defined above.

As illustrated by the example embodiment depicted in FIGS. 1A and 1B, device 100a can comprise a superconducting bus resonator 102 (denoted as Resonator in FIGS. 1A and 1B) that can be coupled to a first superconducting qubit 104a (denoted as tunable coupler qubit (TCQ 1) in FIGS. 1A and 1B) and a second superconducting qubit 104b (denoted as tunable coupler qubit (TCQ 2) in FIGS. 1A and 1B). Superconducting bus resonator 102 illustrated in the example embodiment depicted in FIGS. 1A and 1B can comprise a coplanar wave guide resonator. First superconducting qubit 104a and/or second superconducting qubit 104b illustrated in the example embodiment depicted in FIGS. 1A and 1B can each comprise at least one of a tunable coupler qubit, a two junction qubit, a multimode qubit, a multimode two junction qubit, or a tunable qubit.

Superconducting bus resonator 102 illustrated in the example embodiment depicted in FIGS. 1A and 1B can comprise a first superconducting pad 102a, a second superconducting pad 102b, a third superconducting pad 102c, and/or a fourth superconducting pad 102d, where each of such superconducting pads can comprise an electrode. In this example embodiment, each of first superconducting pad 102a, a second superconducting pad 102b, a third superconducting pad 102c, and/or a fourth superconducting pad 102d can comprise a superconducting film (e.g., a superconducting metal film) that can be formed on a substrate (e.g., a silicon (Si) substrate, etc.) using one or more semiconductor and/or superconductor device fabrication techniques described below. As illustrated in the example embodiment depicted in FIG. 1B, superconducting bus resonator 102 can further comprise an inductor 132 (denoted as $L_R$ in FIG. 1B), a capacitor 134 (denoted as CR in FIG. 1B), and/or a ground 136. As illustrated in the example embodiment depicted in FIG. 1B, superconducting bus resonator 102 can have a resonant frequency (fr) of 6 gigahertz (GHz).

First superconducting qubit 104a illustrated in the example embodiment depicted in FIGS. 1A and 1B can comprise a first superconducting pad 106a, a second superconducting pad 108a, and/or a third superconducting pad 110a, where each of such superconducting pads can comprise an electrode. In this example embodiment, each of first superconducting pad 106a, second superconducting pad 108a, and/or third superconducting pad 110a can comprise a superconducting film (e.g., a superconducting metal film) that can be formed on a substrate (e.g., a silicon (Si) substrate, etc.) using one or more semiconductor and/or superconductor device fabrication techniques described below. First superconducting qubit 104a illustrated in the example embodiment depicted in FIGS. 1A and 1B can further comprise a first Josephson Junction 112a (denoted as $E_{J1}$ in FIG. 1B) coupled to first superconducting pad 106a and second superconducting pad 108a. First superconducting qubit 104a illustrated in the example embodiment depicted in FIGS. 1A and 1B can further comprise a second Josephson Junction 114a (denoted as $E_{J2}$ in FIG. 1B) coupled to second superconducting pad 108a and third superconducting pad 110a. In this example embodiment, first Josephson Junction 112a and/or second Josephson Junction 114a can comprise one or more superconducting films (e.g., superconducting metal film(s)) and/or one or more non-superconducting films (e.g., normal metal film(s)) formed on a substrate (e.g., a silicon (Si) substrate, etc.).

As illustrated in the example embodiment depicted in FIGS. 1A and 1B, first superconducting pad 106a and second superconducting pad 108a of first superconducting qubit 104a can be capacitively coupled to one another, where such capacitive coupling is represented in FIG. 1B by a first capacitor 116a (denoted as $C_1$ in FIG. 1B). As illustrated in the example embodiment depicted in FIGS. 1A and 1B, second superconducting pad 108a and third superconducting pad 110a of first superconducting qubit 104a can be capacitively coupled to one another, where such capacitive coupling is represented in FIG. 1B by a second capacitor 118a (denoted as $C_2$ in FIG. 1B). In the example embodiment illustrated in FIG. 1B, first capacitor 116a and second capacitor 118a represent the direct capacitive shunting across first Josephson Junction 112a and second Josephson Junction 114a, respectively. In this example embodiment, as illustrated in FIGS. 1A and 1B, first superconducting qubit 104a can comprise two capacitively shunted Josephson Junctions, first Josephson Junction 112a and second Josephson Junction 114a, connected in series.

Second superconducting qubit 104b illustrated in the example embodiment depicted in FIGS. 1A and 1B can comprise a first superconducting pad 106b, a second superconducting pad 108b, and/or a third superconducting pad 110b, where each of such superconducting pads can comprise an electrode. In this example embodiment, each of first superconducting pad 106b, second superconducting pad 108b, and/or third superconducting pad 110b can comprise a superconducting film (e.g., a superconducting metal film) that can be formed on a substrate (e.g., a silicon (Si) substrate, etc.) using one or more semiconductor and/or superconductor device fabrication techniques described below. Second superconducting qubit 104b illustrated in the example embodiment depicted in FIGS. 1A and 1B can further comprise a first Josephson Junction 112b (denoted as $E_{J3}$ in FIG. 1B) coupled to first superconducting pad 106b and second superconducting pad 108b. Second superconducting qubit 104b illustrated in the example embodiment depicted in FIGS. 1A and 1B can further comprise a second Josephson Junction 114b (denoted as $E_{J4}$ in FIG. 1B) coupled to second superconducting pad 108b and third superconducting pad 110b. In this example embodiment, first Josephson Junction 112b and/or second Josephson Junction 114b can comprise one or more superconducting films (e.g., superconducting metal film(s)) and/or one or more non-superconducting films (e.g., normal metal film(s)) formed on a substrate (e.g., a silicon (Si) substrate, etc.).

As illustrated in the example embodiment depicted in FIGS. 1A and 1B, first superconducting pad 106b and second superconducting pad 108b of second superconducting qubit 104b can be capacitively coupled to one another, where such capacitive coupling is represented in FIG. 1B by a first capacitor 116b (denoted as $C_3$ in FIG. 1B). As illustrated in the example embodiment depicted in FIGS. 1A and 1B, second superconducting pad 108b and third superconducting pad 110b of second superconducting qubit 104b can be capacitively coupled to one another, where such capacitive coupling is represented in FIG. 1B by a second capacitor 118b (denoted as $C_4$ in FIG. 1B). In the example embodiment illustrated in FIG. 1B, first capacitor 116b and second capacitor 118b represent the direct capacitive shunting across first Josephson Junction 112b and second Josephson Junction 114b, respectively. In this example embodiment, as illustrated in FIGS. 1A and 1B, second superconducting qubit 104b can comprise two capacitively shunted Josephson Junctions, first Josephson Junction 112b and second Josephson Junction 114b, connected in series.

First superconducting qubit 104a and second superconducting qubit 104b illustrated in the example embodiment depicted in FIGS. 1A and 1B can each operate in a first oscillating mode and a second oscillating mode (not illustrated in the figures). In some embodiments of the subject disclosure described herein, the first oscillating mode and the second oscillating mode can correspond to different (e.g., distinct) frequencies and/or different (e.g., distinct) spatial symmetries with respect to one another. In these embodiments, the first oscillating mode and the second oscillating mode can be indicative of symmetric and antisymmetric combinations of excitations associated with: first Josephson Junction 112a and second Josephson Junction 114a of first superconducting qubit 104a; and/or first Josephson Junction 112b and second Josephson Junction 114b of second superconducting qubit 104b. In these embodiments, such symmetric and antisymmetric combinations of excitations associated with first Josephson Junction 112a and second Josephson Junction 114a of first superconducting qubit 104a can result from a capacitive coupling of first superconducting pad 106a and third superconducting pad 110a of first superconducting qubit 104a, where such capacitive coupling is represented in FIG. 1B as a third capacitor 120a (denoted as $C_{S1}$ in FIG. 1B). In these embodiments, such symmetric and antisymmetric combinations of excitations associated with first Josephson Junction 112b and second Josephson Junction 114b of second superconducting qubit 104b can result from a capacitive coupling of first superconducting pad 106b and third superconducting pad 110b of second superconducting qubit 104b, where such capacitive coupling is represented in FIG. 1B as a third capacitor 120b (denoted as $C_{S2}$ in FIG. 1B).

In the example embodiment illustrated in FIGS. 1A and 1B, third capacitor 120a represents the capacitive coupling between first superconducting pad 106a and third superconducting pad 110a of first superconducting qubit 104a, where such capacitive coupling can enable creation of the first oscillating mode and the second oscillating mode having different frequencies and different spatial symmetries relative to one another as described above. In this example embodiment, such capacitive coupling represented as third capacitor 120a in FIG. 1B can enable the first oscillating mode and the second oscillating mode to interact with each other, where such modes would otherwise be isolated across first Josephson Junction 112a and second Josephson Junction 114a of first superconducting qubit 104a. In this example embodiment, such interaction between the first oscillating mode and the second oscillating mode can enable creation of extended states (e.g., hybridized quantum states, hybridized oscillating modes, etc.) of first superconducting qubit 104a (e.g., hybridized quantum states and/or hybridized oscillating modes corresponding to different frequencies and different spatial symmetries). In this example embodiment, such capacitive coupling represented as third capacitor 120a in FIG. 1B can enable the fundamental mode of first superconducting qubit 104a to extend across first Josephson Junction 112a and second Josephson Junction 114a, symmetrically or antisymmetrically.

In the example embodiment illustrated in FIGS. 1A and 1B, third capacitor 120b represents the capacitive coupling between first superconducting pad 106b and third superconducting pad 110b of second superconducting qubit 104b, where such capacitive coupling can enable creation of the first oscillating mode and the second oscillating mode having different frequencies and different spatial symmetries relative to one another as described above. In this example embodiment, such capacitive coupling represented as third capacitor 120b in FIG. 1B can enable the first oscillating mode and the second oscillating mode to interact with each other, where such modes would otherwise be isolated across first Josephson Junction 112b and second Josephson Junction 114b of second superconducting qubit 104b. In this example embodiment, such interaction between the first oscillating mode and the second oscillating mode can enable creation of extended states (e.g., hybridized quantum states, hybridized oscillating modes, etc.) of second superconducting qubit 104b (e.g., hybridized quantum states and/or hybridized oscillating modes corresponding to different frequencies and different spatial symmetries). In this example embodiment, such capacitive coupling represented as third capacitor 120b in FIG. 1B can enable the fundamental mode of second superconducting qubit 104b to extend across first Josephson Junction 112b and second Josephson Junction 114b, symmetrically or antisymmetrically.

The first oscillating mode and the second oscillating mode can respectively correspond to a first oscillating mode structure 124a (denoted as A mode in FIG. 1A) and a second oscillating mode structure 124b (denoted as B mode in FIG. 1A). In the example embodiment illustrated in FIGS. 1A and 1B, first oscillating mode structure 124a and second oscillating mode structure 124b can each define a certain coupling technique (e.g., coupling scheme, coupling arrangement, coupling pattern, etc.) that can be used to encode and/or store quantum information in the first oscillating mode of first superconducting qubit 104a and/or second superconducting qubit 104b. Consequently, in this example embodiment, the first oscillating mode and/or the second oscillating mode of first superconducting qubit 104a and/or second superconducting qubit 104b can comprise encoded quantum information (e.g., qubit information, quantum state information, etc.). In this example embodiment, first oscillating mode structure 124a and/or second oscillating mode structure 124b can be used to couple superconducting bus resonator 102 to the first oscillating mode and/or the second oscillating mode such that superconducting bus resonator 102 can operate in accordance with the first oscillating mode and/or the second oscillating mode of first superconducting qubit 104a and/or second superconducting qubit 104b.

First superconducting qubit 104a and/or second superconducting qubit 104b illustrated in the example embodiment depicted in FIGS. 1A and 1B can be capacitively coupled to superconducting bus resonator 102. In the example embodiment illustrated in FIGS. 1A and 1B, first superconducting pad 102a of superconducting bus resonator 102 can be capacitively coupled to first superconducting pad 106a of first superconducting qubit 104a, where such capacitive coupling is represented in FIG. 1B by a capacitor 126a (denoted as $C_{c1}$ in FIG. 1B). In this example embodiment, second superconducting pad 102b of superconducting bus resonator 102 can be capacitively coupled to second superconducting pad 108a of first superconducting qubit 104a, where such capacitive coupling is represented in FIG. 1B by a capacitor 128a (denoted as $C_{c2}$ in FIG. 1B). In this example embodiment, third superconducting pad 102c of superconducting bus resonator 102 can be capacitively coupled to first superconducting pad 106b of second superconducting qubit 104b, where such capacitive coupling is represented in FIG. 1B by a capacitor 126b (denoted as $C_{c3}$ in FIG. 1B). In this example embodiment, fourth superconducting pad 102d of superconducting bus resonator 102 can be capacitively coupled to second superconducting pad 108a of second superconducting qubit 104b, where such capacitive coupling is represented in FIG. 1B by a capacitor 128b (denoted as $C_{c4}$ in FIG. 1B).

In some embodiments, superconducting bus resonator 102 can be coupled to first superconducting qubit 104a and second superconducting qubit 104b based on (e.g., in accordance with) first oscillating mode structure 124a corresponding to the first oscillating mode of first superconducting qubit 104a and second superconducting qubit 104b, where the first oscillating mode can comprise a coupling mode. In these embodiments, second oscillating mode structure 124b corresponding to the second oscillating mode of first superconducting qubit 104a and second superconducting qubit 104b can enable encoding and/or storing quantum information (e.g., qubit information, quantum state information, etc.) in the second oscillating mode of first superconducting qubit 104a and second superconducting qubit 104b, where the second oscillating mode can comprise a data mode. In other embodiments, superconducting bus resonator 102 can be coupled to first superconducting qubit 104a and second superconducting qubit 104b based on (e.g., in accordance with) second oscillating mode structure 124b corresponding to the second oscillating mode of first superconducting qubit 104a and second superconducting qubit 104b, where the second oscillating mode can comprise a coupling mode. In these embodiments, first oscillating mode structure 124a corresponding to the first oscillating mode of first superconducting qubit 104a and second superconducting qubit 104b can enable encoding and/or storing quantum information (e.g., qubit information, quantum state information, etc.) in the first oscillating mode of first superconducting qubit 104a and second superconducting qubit 104b, where the first oscillating mode can comprise a data mode. As reference herein, such mode coupling schemes described in the above embodiments can constitute mode-selective coupling schemes that can be realized by an entity (e.g., a human, a computing device, a software application, an agent, a machine learning model, an artificial intelligence model, etc.) that implements one or more of the embodiments of the subject disclosure described herein (e.g., device 100a, device 200a, device 300, etc.).

In the example embodiment depicted in FIGS. 1A and 1B, superconducting bus resonator 102 can be coupled to first superconducting qubit 104a and second superconducting qubit 104*b* based on (e.g., in accordance with) second oscillating mode structure 124*b* corresponding to the second oscillating mode of first superconducting qubit 104*a* and second superconducting qubit 104*b*, where the second oscillating mode can comprise a coupling mode. In this example embodiment depicted in FIGS. 1A and 1B, first oscillating mode structure 124*a* corresponding to the first oscillating mode of first superconducting qubit 104*a* and second superconducting qubit 104*b* can enable encoding and/or storing quantum information (e.g., qubit information, quantum state information, etc.) in the first oscillating mode of first superconducting qubit 104*a* and second superconducting qubit 104*b*, where the first oscillating mode can comprise a data mode.

In the example embodiment illustrated in FIGS. 1A and 1B, by encoding and/or storing quantum information in the first oscillating mode of first superconducting qubit 104*a* and second superconducting qubit 104*b* while coupling superconducting bus resonator 102 to first superconducting qubit 104*a* and second superconducting qubit 104*b* based on (e.g., in accordance with) second oscillating mode structure 124*b* corresponding to the second oscillating mode, device 100*a* can thereby facilitate suppression (e.g., cancellation, reduction, etc.) of direct interactions between the first oscillating mode of first superconducting qubit 104*a* and the first oscillating mode of second superconducting qubit 104*b*. For instance, in this example embodiment, device 100*a* can thereby facilitate suppression (e.g., cancellation, reduction, etc.) of direct interactions such as, for example, exchange interactions and/or static ZZ interactions between first superconducting qubit 104*a* and second superconducting qubit 104*b* (e.g., between the first oscillating mode of first superconducting qubit 104*a* and the first oscillating mode of second superconducting qubit 104*b*). In this example embodiment, device 100*a* can facilitate suppression of static ZZ interactions between the first oscillating mode of first superconducting qubit 104*a* and the first oscillating mode of second superconducting qubit 104*b* because there is a higher order interaction (e.g., data mode 1→coupling mode 1→bus resonator→coupling mode 2→data mode 2). For example, a higher order interaction that can be expressed as: data mode 1 (e.g., the first oscillating mode of first superconducting qubit 104*a*)→coupling mode 1 (e.g., the second oscillating mode of first superconducting qubit 104*a*)→bus resonator (e.g., superconducting bus resonator 102)→coupling mode 2 (e.g., the second oscillating mode of second superconducting qubit 104*b*)→data mode 2 (the first oscillating mode of second superconducting qubit 104*b*).

In the example embodiment illustrated in FIGS. 1A and 1B, by encoding and/or storing quantum information in the first oscillating mode of first superconducting qubit 104*a* and second superconducting qubit 104*b* while coupling superconducting bus resonator 102 to first superconducting qubit 104*a* and second superconducting qubit 104*b* based on (e.g., in accordance with) second oscillating mode structure 124*b* corresponding to the second oscillating mode, device 100*a* can thereby further facilitate strong (e.g., relatively strong) longitudinal coupling between the first oscillating mode and the second oscillating mode (e.g., between first oscillating mode structure 124*a* and second oscillating mode structure 124*b*) of first superconducting qubit 104*a* and second superconducting qubit 104*b*. In this example embodiment, such strong (e.g., relatively strong) longitudinal coupling between the first oscillating mode and the second oscillating mode (e.g., between first oscillating mode structure 124*a* and second oscillating mode structure 124*b*) of first superconducting qubit 104*a* and second superconducting qubit 104*b* can enable a net longitudinal coupling between superconducting bus resonator 102 and the first oscillating mode of first superconducting qubit 104*a* and second superconducting qubit 104*b*. In this example embodiment, such a net longitudinal coupling (also referred to as a chi shift (chi_01 shift)) between superconducting bus resonator 102 and the first oscillating mode of first superconducting qubit 104*a* and second superconducting qubit 104*b* can enable generation and/or performance of two-qubit entangling gates through a resonator-induced phase (RIP) gate by driving (e.g., via microwave pulses) superconducting bus resonator 102 detuned from its resonant frequency (e.g., 6 GHz).

Additionally, or alternatively, in the example embodiment illustrated in FIGS. 1A and 1B, device 100*a* can further prevent exchange coupling between the data modes and superconducting bus resonator 102, which can protect such data modes from energy loss (e.g., Purcell loss) associated with superconducting bus resonator 102 (e.g., internal energy dissipation or loss of energy to an environment external to device 100*a* through a drive port near superconducting bus resonator 102). For instance, in the example embodiment illustrated in FIGS. 1A and 1B, device 100*a* can prevent: exchange coupling between superconducting bus resonator 102 and the first oscillating mode of first superconducting qubit 104*a*; and/or exchange coupling between superconducting bus resonator 102 and the first oscillating mode of second superconducting qubit 104*b*. In this example embodiment, by preventing such exchange coupling between such data modes and superconducting bus resonator 102 as described above, device 100*a* can thereby facilitate reduced Purcell loss and/or reduced decoherence associated with device 100*a* and/or one or more components thereof (e.g., superconducting bus resonator 102, first superconducting qubit 104*a*, second superconducting qubit 104*b*, etc.).

The various embodiments of the subject disclosure described herein and/or illustrated in the figures (e.g., device 100*a*, device 200*a*, device 300, etc.) can be coupled to one or more external devices (not illustrated in FIG. 1A or 1B) to facilitate operation of such embodiments. For example, with reference to the example embodiment illustrated in FIGS. 1A and 1B, device 100*a*, superconducting bus resonator 102, first superconducting qubit 104*a*, and/or second superconducting qubit 104*b* can be coupled to one or more external devices that can be external to device 100*a* such as, for instance, a pulse generator device, an electrical power source, and/or a magnetic field generator.

In an example embodiment, although not depicted in FIG. 1A or 1B, device 100*a*, superconducting bus resonator 102, first superconducting qubit 104*a*, and/or second superconducting qubit 104*b* can be coupled to a pulse generator device including, but not limited to, an arbitrary waveform generator (AWG), a vector network analyzer (VNA), and/or another pulse generator device that can be external to device 100*a* and can transmit and/or receive pulses (e.g., microwave pulses, microwave signals, control signals, etc.) to and/or from device 100*a*, superconducting bus resonator 102, first superconducting qubit 104*a*, and/or second superconducting qubit 104*b*. In another example, embodiment, although not depicted in FIG. 1A or 1B, device 100*a*, superconducting bus resonator 102, first superconducting qubit 104*a*, and/or second superconducting qubit 104*b* can be coupled to an electrical power source and/or a magnetic field generator that can be external to device 100*a* and can provide an electrical current, an electrical potential, and/or a magnetic field to device 100a, superconducting bus resonator 102, first superconducting qubit 104a, and/or second superconducting qubit 104b.

In the example embodiments above, such one or more external devices (e.g., a pulse generator device (e.g., an AWG, a VNA, etc.), an electrical power source, and/or a magnetic field generator) can also be coupled to a computer (e.g., computer 1012 described below with reference to FIG. 10) comprising a memory (e.g., system memory 1016 described below with reference to FIG. 10) that can store instructions thereon (e.g., software, routines, processing threads, etc.) and a processor (e.g., processing unit 1014 described below with reference to FIG. 10) that can execute such instructions that can be stored on the memory. In these example embodiments, such a computer can be employed to operate and/or control (e.g., via processing unit 1014 executing instructions stored on system memory 1016) such one or more external devices (e.g., a pulse generator device (e.g., an AWG, a VNA, etc.), an electrical power source, and/or a magnetic field generator). For instance, in these example embodiments, such a computer can be employed to enable one or more external devices (e.g., a pulse generator device (e.g., an AWG, a VNA, etc.), an electrical power source, and/or a magnetic field generator) to: a) transmit and/or receive pulses (e.g., microwave pulses, microwave signals, control signals, etc.) to and/or from device 100a, superconducting bus resonator 102, first superconducting qubit 104a, and/or second superconducting qubit 104b; and/or b) provide an electrical current, an electrical potential, and/or a magnetic field to device 100a, superconducting bus resonator 102, first superconducting qubit 104a, and/or second superconducting qubit 104b.

In various embodiments, an entity that implements device 100a (e.g., an entity such as, for instance, a human, a computing device, a software application, an agent, a machine learning model, an artificial intelligence model, etc.) can implement one or more of the mode-selective coupling schemes described herein in accordance with one or more embodiments of the subject disclosure (e.g., mode-selective coupling schemes described and illustrated in FIGS. 1A, 1B, 2A, 2B, and/or 3). In these embodiments, such an entity can implement one or more of such mode-selective schemes by setting and/or adjusting one or more coupling capacitances between superconducting bus resonator 102 and the one or more superconducting pads of first superconducting qubit 104a and/or second superconducting qubit 104b such that one or more of such mode-selective schemes are achieved. In these embodiments, such an entity can set and/or adjust such one or more coupling capacitances (e.g., coupling capacitances of capacitor 126a, capacitor 126b, capacitor 128a, and/or capacitor 128b) by applying and/or adjusting (e.g., via one or more of the above defined external devices and/or computer 1012 as described above) a magnetic field, an electrical current, an electrical potential, and/or a microwave pulse applied to device 100a and/or one or more components thereof (e.g., superconducting bus resonator 102, first superconducting qubit 104a, second superconducting qubit 104b, etc.).

In the example embodiment illustrated in FIGS. 1A and 1B, such an entity defined above can set and/or adjust coupling capacitances represented as capacitor 126a, capacitor 126b, capacitor 128a, and/or capacitor 128b in FIG. 1B by applying and/or adjusting (e.g., via one or more of the above defined external devices and/or computer 1012 as described above) a magnetic field, an electrical current, an electrical potential, and/or a microwave pulse applied to device 100a and/or one or more components thereof (e.g., superconducting bus resonator 102, first superconducting qubit 104a, second superconducting qubit 104b, etc.). In this example embodiment, based on setting and/or adjusting such coupling capacitances described above, an entity as defined herein can thereby realize the mode-selective coupling scheme described above, where: superconducting bus resonator 102 can be coupled to first superconducting qubit 104a and second superconducting qubit 104b based on (e.g., in accordance with) second oscillating mode structure 124b corresponding to the second oscillating mode of first superconducting qubit 104a and second superconducting qubit 104b, where the second oscillating mode comprises a coupling mode; and/or quantum information (e.g., qubit information, quantum state information, etc.) can be encoded and/or stored in the first oscillating mode of first superconducting qubit 104a and second superconducting qubit 104b based on (e.g., in accordance with) first oscillating mode structure 124a, where the first oscillating mode can comprise a data mode.

In this example embodiment, to realize a net exchange coupling of superconducting bus resonator 102 to only the second oscillating mode of first superconducting qubit 104a and second superconducting qubit 104b (e.g., a net exchange coupling of superconducting bus resonator 102 to only second oscillating mode structure 124b corresponding to the second oscillating mode of first superconducting qubit 104a and second superconducting qubit 104b), such an entity defined herein can set and/or adjust such coupling capacitances as follows: capacitor 126a=2*capacitor 128a (e.g., $C_{c1}=2*C_{c2}$) and capacitor 126b=2*capacitor 128b (e.g., $C_{c3}=2*C_{c4}$).

In the above embodiment, based on realizing the above described mode-selective coupling scheme, an entity implementing device 100a can thereby facilitate: a) suppression (e.g., cancellation, reduction, etc.) of direct interactions such as, for example, exchange interactions and/or static ZZ interactions between first superconducting qubit 104a and second superconducting qubit 104b (e.g., between the first oscillating mode of first superconducting qubit 104a and the first oscillating mode of second superconducting qubit 104b, where the first oscillating mode and the second oscillating mode can comprise data modes of first superconducting qubit 104a and second superconducting qubit 104b); b) strong (e.g., relatively strong) longitudinal coupling between the first oscillating mode and the second oscillating mode (e.g., between first oscillating mode structure 124a and second oscillating mode structure 124b) of first superconducting qubit 104a and second superconducting qubit 104b; and/or c) prevention of exchange coupling between the data modes (e.g., between the first oscillating mode and the second oscillating mode) and superconducting bus resonator 102, which can reduce energy loss (e.g., Purcell loss) and/or decoherence associated with device 100a and/or superconducting bus resonator 102. In this embodiment, based on such suppression of such static ZZ interactions, reduced energy loss, and/or reduced decoherence associated with superconducting bus resonator 102, device 100a can thereby facilitate: reduced quantum gate errors associated with first superconducting qubit 104a and/or second superconducting qubit 104b; increased speed of a quantum gate comprising first superconducting qubit 104a and second superconducting qubit 104b; and/or at least one of improved fidelity, improved accuracy, or improved performance of a quantum processor comprising device 100a.

In the above embodiment, an entity as defined herein that implements device 100a can further drive (e.g., via a microwave pulse using one or more of the above defined external devices and/or computer 1012 as described above) superconducting bus resonator 102 detuned from its resonant frequency (e.g., 6 GHz) to generate and/or perform two-qubit entangling gates through an RIP gate. For example, in this embodiment, by driving superconducting bus resonator 102 detuned from its resonant frequency as described above, such an entity can entangle first superconducting qubit 104a and second superconducting qubit 104b (e.g., to produce an entanglement quantum gate between first superconducting qubit 104a and second superconducting qubit 104b). In this embodiment, such entanglement of first superconducting qubit 104a and second superconducting qubit 104b can enable a quantum gate operation to be performed between first superconducting qubit 104a and second superconducting qubit 104b. For example, in this embodiment, based on driving superconducting bus resonator 102 detuned from its resonant frequency, device 100a and/or superconducting bus resonator 102 can operate as an RIP gate, which can generate ZZ interactions between a first qubit (e.g., first superconducting qubit 104a) and a second qubit (e.g., second superconducting qubit 104b) that are present when there is a microwave drive (e.g., microwave pulse, microwave signal, control signal, etc.) at superconducting bus resonator 102 (e.g., when there is a microwave signal applied to superconducting bus resonator 102).

Fabrication of the various embodiments of the subject disclosure described herein and/or illustrated in the figures (e.g., device 100a, device 200a, device 300, etc.) can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, the various embodiments of the subject disclosure described herein and/or illustrated in the figures (e.g., device 100a, device 200a, device 300, etc.) can be fabricated on a substrate (e.g., a silicon (Si) substrate, etc.) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

The various embodiments of the subject disclosure described herein and/or illustrated in the figures (e.g., device 100a, device 200a, device 300, etc.) can be fabricated using various materials. For example, the various embodiments of the subject disclosure described herein and/or illustrated in the figures (e.g., device 100a, device 200a, device 300, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

Figure 2A:
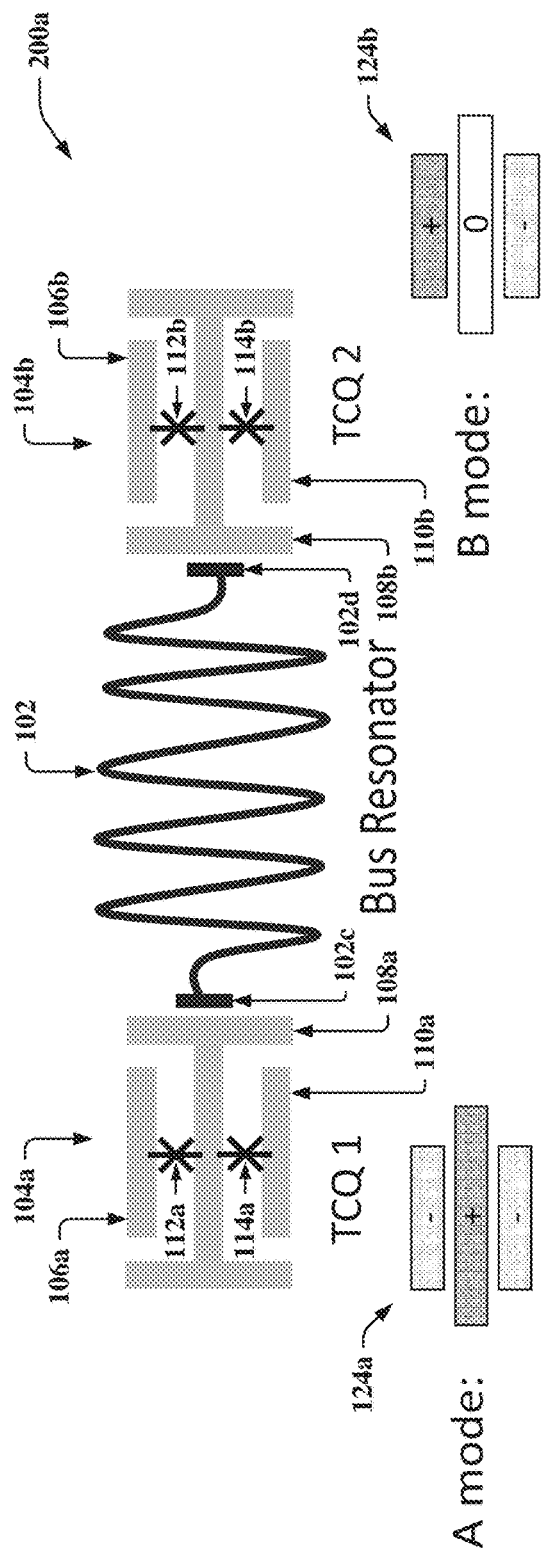
FIG. 2A illustrates a top view of an example, non-limiting device that can facilitate static ZZ suppression and Purcell loss reduction using mode-selective coupling in two-junction superconducting qubits in accordance with one or more embodiments described herein.
Figure 2B:
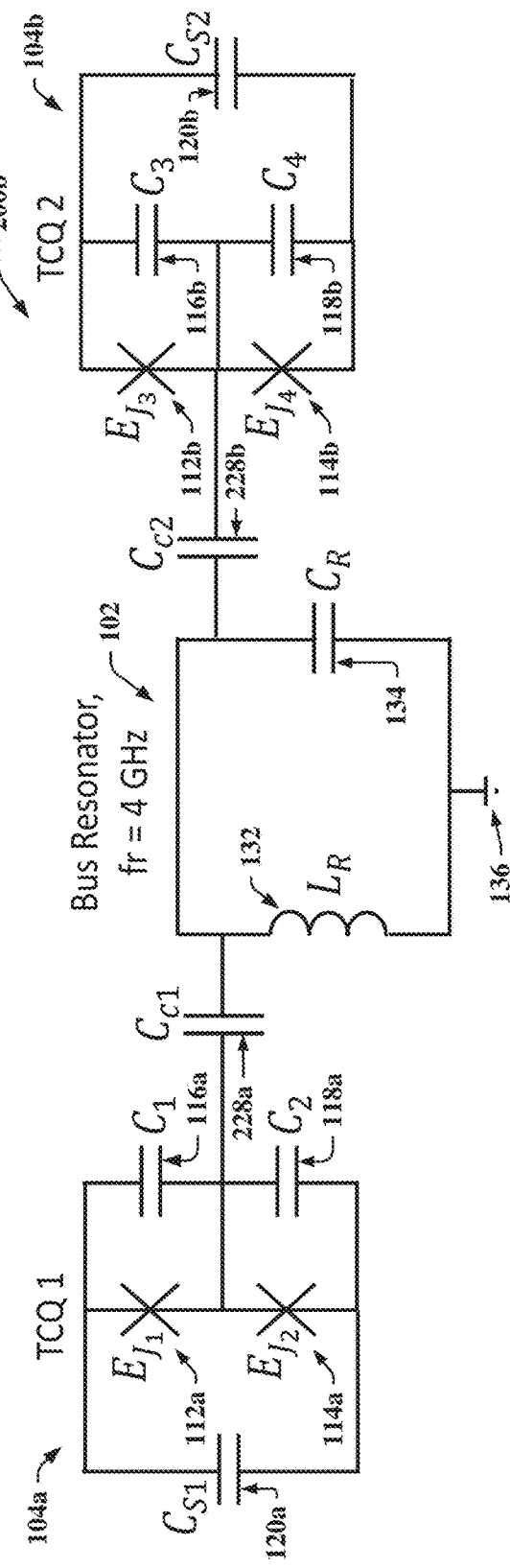
FIG. 2B illustrates an example, non-limiting circuit schematic of the device of FIG. 2A.

FIG. 2A illustrates a top view of an example, non-limiting device 200a that can facilitate static ZZ suppression and Purcell loss reduction using mode-selective coupling in two-junction superconducting qubits in accordance with one or more embodiments described herein. FIG. 2B illustrates an example, non-limiting circuit schematic 200b of device 200a. Repetitive description of like elements and/or processes employed in respective embodiments is omitted for sake of brevity.

Device 200a can comprise an example, non-limiting alternative embodiment of device 100a described above with reference to FIGS. 1A and 1B. For instance, as illustrated in the example embodiment illustrated in FIGS. 2A and 2B, device 200a can comprise an example, non-limiting alternative embodiment of device 100a, where only second superconducting pad 108a of first superconducting qubit 104a and second superconducting pad 108b of second superconducting qubit 104b are respectively coupled to third superconducting pad 102c and fourth superconducting pad 102d of superconducting bus resonator 102. Additionally, or alternatively, as illustrated in the example embodiment depicted in FIG. 2B, superconducting bus resonator 102 of device 200a can have a resonant frequency (fr) of 4 GHz.

As illustrated in the example embodiment illustrated in FIGS. 2A and 2B, second superconducting pad 108a of first superconducting qubit 104a can be capacitively coupled to third superconducting pad 102c of superconducting bus resonator 102, where such capacitive coupling is represented in FIG. 2B by a first capacitor 228a (denoted as $C_{c1}$ in FIG. 2B). In this example embodiment, second superconducting pad 108b of second superconducting qubit 104b can be capacitively coupled to fourth superconducting pad 102d of superconducting bus resonator 102, where such capacitive coupling is represented in FIG. 2B by a second capacitor 228b (denoted as $C_{c2}$ in FIG. 2B).

As described above with reference to FIGS. 1A and 1B, in some embodiments, superconducting bus resonator 102 can be coupled to first superconducting qubit 104a and second superconducting qubit 104b based on (e.g., in accordance with) first oscillating mode structure 124a corresponding to the first oscillating mode of first superconducting qubit 104a and second superconducting qubit 104b, where the first oscillating mode can comprise a coupling mode. In these embodiments, second oscillating mode structure 124b corresponding to the second oscillating mode of first superconducting qubit 104a and second superconducting qubit 104b can enable encoding and/or storing quantum information (e.g., qubit information, quantum state information, etc.) in the second oscillating mode of first superconducting qubit 104a and second superconducting qubit 104b, where the second oscillating mode can comprise a data mode.

In the example embodiment illustrated in FIGS. 2A and 2B, superconducting bus resonator 102 can be coupled to first superconducting qubit 104a and second superconducting qubit 104b based on (e.g., in accordance with) first oscillating mode structure 124a corresponding to the first oscillating mode of first superconducting qubit 104a and second superconducting qubit 104b, where the first oscillating mode can comprise a coupling mode. In this example embodiment illustrated in FIGS. 2A and 2B, second oscillating mode structure 124b corresponding to the second oscillating mode of first superconducting qubit 104a and second superconducting qubit 104b can enable encoding and/or storing quantum information (e.g., qubit information, quantum state information, etc.) in the second oscillating mode of first superconducting qubit 104a and second superconducting qubit 104b, where the second oscillating mode can comprise a data mode.

In the example embodiment illustrated in FIGS. 2A and 2B, by encoding and/or storing quantum information in the second oscillating mode of first superconducting qubit 104a and second superconducting qubit 104b while coupling superconducting bus resonator 102 to first superconducting qubit 104a and second superconducting qubit 104b based on (e.g., in accordance with) first oscillating mode structure 124a corresponding to the first oscillating mode, device 200a can thereby facilitate suppression (e.g., cancellation, reduction, etc.) of direct interactions between the second oscillating mode of first superconducting qubit 104a and the second oscillating mode of second superconducting qubit 104b. For instance, in this example embodiment, device 200a can thereby facilitate suppression (e.g., cancellation, reduction, etc.) of direct interactions such as, for example, exchange interactions and/or static ZZ interactions between first superconducting qubit 104a and second superconducting qubit 104b (e.g., between the second oscillating mode of first superconducting qubit 104a and the second oscillating mode of second superconducting qubit 104b). In this example embodiment, device 200a can facilitate suppression of static ZZ interactions between the second oscillating mode of first superconducting qubit 104a and the second oscillating mode of second superconducting qubit 104b because there is a higher order interaction (e.g., data mode 1→coupling mode 1→bus resonator→coupling mode 2→data mode 2). For example, a higher order interaction that can be expressed as: data mode 1 (e.g., the second oscillating mode of first superconducting qubit 104a)→coupling mode 1 (e.g., the first oscillating mode of first superconducting qubit 104a)→bus resonator (e.g., superconducting bus resonator 102)→coupling mode 2 (e.g., the first oscillating mode of second superconducting qubit 104b)→data mode 2 (the second oscillating mode of second superconducting qubit 104b).

In the example embodiment illustrated in FIGS. 2A and 2B, by encoding and/or storing quantum information in the second oscillating mode of first superconducting qubit 104a and second superconducting qubit 104b while coupling superconducting bus resonator 102 to first superconducting qubit 104a and second superconducting qubit 104b based on (e.g., in accordance with) first oscillating mode structure 124a corresponding to the first oscillating mode, device 200a can thereby further facilitate strong (e.g., relatively strong) longitudinal coupling between the first oscillating mode and the second oscillating mode (e.g., between first oscillating mode structure 124a and second oscillating mode structure 124b) of first superconducting qubit 104a and second superconducting qubit 104b. In this example embodiment, such strong (e.g., relatively strong) longitudinal coupling between the first oscillating mode and the second oscillating mode (e.g., between first oscillating mode structure 124a and second oscillating mode structure 124b) of first superconducting qubit 104a and second superconducting qubit 104b can enable a net longitudinal coupling between superconducting bus resonator 102 and the second oscillating mode of first superconducting qubit 104a and second superconducting qubit 104b. In this example embodiment, such a net longitudinal coupling (also referred to as a chi shift (chi_01 shift)) between superconducting bus resonator 102 and the second oscillating mode of first superconducting qubit 104a and second superconducting qubit 104b can enable generation and/or performance of two-qubit entangling gates through an RIP gate by driving (e.g., via microwave pulses) superconducting bus resonator 102 detuned from its resonant frequency (e.g., 4 GHz).

Additionally, or alternatively, in the example embodiment illustrated in FIGS. 2A and 2B, device 200a can further prevent exchange coupling between the data modes and superconducting bus resonator 102, which can protect such data modes from energy loss (e.g., Purcell loss) associated with superconducting bus resonator 102 (e.g., internal energy dissipation or loss of energy to an environment external to device 200a through a drive port near superconducting bus resonator 102). For instance, in the example embodiment illustrated in FIGS. 2A and 2B, device 200a can prevent: exchange coupling between superconducting bus resonator 102 and the second oscillating mode of first superconducting qubit 104a; and/or exchange coupling between superconducting bus resonator 102 and the second oscillating mode of second superconducting qubit 104b. In this example embodiment, by preventing such exchange coupling between such data modes and superconducting bus resonator 102 as described above, device 200a can thereby facilitate reduced Purcell loss and/or reduced decoherence associated with device 200a and/or one or more components thereof (e.g., superconducting bus resonator 102, first superconducting qubit 104a, second superconducting qubit 104b, etc.).

As described above with reference to FIGS. 1A and 1B, the various embodiments of the subject disclosure described herein and/or illustrated in the figures (e.g., device 100a, device 200a, device 300, etc.) can be coupled to one or more external devices (not illustrated in FIG. 2A or 2B) to facilitate operation of such embodiments. For example, with reference to the example embodiment illustrated in FIGS. 2A and 2B, device 200a, superconducting bus resonator 102, first superconducting qubit 104a, and/or second superconducting qubit 104b can be coupled to one or more external devices that can be external to device 100a such as, for instance, a pulse generator device, an electrical power source, and/or a magnetic field generator.

In an example embodiment, although not depicted in FIG. 2A or 2B, device 200a, superconducting bus resonator 102, first superconducting qubit 104a, and/or second superconducting qubit 104b can be coupled to a pulse generator device (e.g., an AWG, a VNA, etc.) that can be external to device 200a and can transmit and/or receive pulses (e.g., microwave pulses, microwave signals, control signals, etc.) to and/or from device 200a, superconducting bus resonator 102, first superconducting qubit 104a, and/or second superconducting qubit 104b. In another example, embodiment, although not depicted in FIG. 2A or 2B, device 200a, superconducting bus resonator 102, first superconducting qubit 104a, and/or second superconducting qubit 104b can be coupled to an electrical power source and/or a magnetic field generator that can be external to device 200a and can provide an electrical current, an electrical potential, and/or a magnetic field to device 200a, superconducting bus resonator 102, first superconducting qubit 104a, and/or second superconducting qubit 104b.

In the example embodiments above, such one or more external devices (e.g., a pulse generator device (e.g., an AWG, a VNA, etc.), an electrical power source, and/or a magnetic field generator) can also be coupled to a computer (e.g., computer 1012 described below with reference to FIG. 10) comprising a memory (e.g., system memory 1016 described below with reference to FIG. 10) that can store instructions thereon (e.g., software, routines, processing threads, etc.) and a processor (e.g., processing unit 1014 described below with reference to FIG. 10) that can execute such instructions that can be stored on the memory. In these example embodiments, such a computer can be employed to operate and/or control (e.g., via processing unit 1014 executing instructions stored on system memory 1016) such one or more external devices (e.g., a pulse generator device (e.g., an AWG, a VNA, etc.), an electrical power source, and/or a magnetic field generator). For instance, in these example embodiments, such a computer can be employed to enable the one or more external devices (e.g., a pulse generator device (e.g., an AWG, a VNA, etc.), an electrical power source, and/or a magnetic field generator) to: a) transmit and/or receive pulses (e.g., microwave pulses, microwave signals, control signals, etc.) to and/or from device 200a, superconducting bus resonator 102, first superconducting qubit 104a, and/or second superconducting qubit 104b; and/or b) provide an electrical current, an electrical potential, and/or a magnetic field to device 200a, superconducting bus resonator 102, first superconducting qubit 104a, and/or second superconducting qubit 104b.

In various embodiments, an entity as defined above with reference to FIGS. 1A and 1B that implements device 200a can implement one or more of the mode-selective coupling schemes described herein in accordance with one or more embodiments of the subject disclosure (e.g., mode-selective coupling schemes described and illustrated in FIGS. 1A, 1B, 2A, 2B, and/or 3). In these embodiments, such an entity can implement one or more of such mode-selective schemes by setting and/or adjusting one or more coupling capacitances between superconducting bus resonator 102 and the one or more superconducting pads of first superconducting qubit 104a and/or second superconducting qubit 104b such that one or more of such mode-selective schemes are achieved. In these embodiments, such an entity can set and/or adjust such one or more coupling capacitances (e.g., coupling capacitances of capacitor 228a and/or capacitor 228b of device 200a illustrated in FIG. 1B) by applying and/or adjusting (e.g., via one or more of the above defined external devices and/or computer 1012 as described above) a magnetic field, an electrical current, an electrical potential, and/or a microwave pulse applied to device 200a and/or one or more components thereof (e.g., superconducting bus resonator 102, first superconducting qubit 104a, second superconducting qubit 104b, etc.).

In the example embodiment illustrated in FIGS. 2A and 2B, such an entity defined herein can set and/or adjust coupling capacitances represented as capacitor 228a and/or capacitor 228b in FIG. 2B by applying and/or adjusting (e.g., via one or more of the above defined external devices and/or computer 1012 as described above) a magnetic field, an electrical current, an electrical potential, and/or a microwave pulse applied to device 200a and/or one or more components thereof (e.g., superconducting bus resonator 102, first superconducting qubit 104a, second superconducting qubit 104b, etc.). In this example embodiment, based on setting and/or adjusting such coupling capacitances described above, an entity as defined herein can thereby realize the mode-selective coupling scheme described above, where: superconducting bus resonator 102 can be coupled to first superconducting qubit 104a and second superconducting qubit 104b based on (e.g., in accordance with) first oscillating mode structure 124a corresponding to the first oscillating mode of first superconducting qubit 104a and second superconducting qubit 104b, where the first oscillating mode comprises a coupling mode; and/or quantum information (e.g., qubit information, quantum state information, etc.) can be encoded and/or stored in the second oscillating mode of first superconducting qubit 104a and second superconducting qubit 104b based on (e.g., in accordance with) second oscillating mode structure 124b, where the second oscillating mode can comprise a data mode.

In the above embodiment, based on realizing the above described mode-selective coupling scheme, an entity implementing device 200a can thereby facilitate: a) suppression (e.g., cancellation, reduction, etc.) of direct interactions such as, for example, exchange interactions and/or static ZZ interactions between first superconducting qubit 104a and second superconducting qubit 104b (e.g., between the second oscillating mode of first superconducting qubit 104a and the second oscillating mode of second superconducting qubit 104b, where the first oscillating mode and the second oscillating mode can comprise data modes of first superconducting qubit 104a and second superconducting qubit 104b); b) strong (e.g., relatively strong) longitudinal coupling between the first oscillating mode and the second oscillating mode (e.g., between first oscillating mode structure 124a and second oscillating mode structure 124b) of first superconducting qubit 104a and second superconducting qubit 104b; and/or c) prevention of exchange coupling between the data modes (e.g., between the first oscillating mode and the second oscillating mode) and superconducting bus resonator 102, which can reduce energy loss (e.g., Purcell loss) and/or decoherence associated with device 200a and/or superconducting bus resonator 102. In this embodiment, based on such suppression of such static ZZ interactions, reduced energy loss, and/or reduced decoherence associated with superconducting bus resonator 102, device 200a can thereby facilitate: reduced quantum gate errors associated with first superconducting qubit 104a and/or second superconducting qubit 104b; increased speed of a quantum gate comprising first superconducting qubit 104a and second superconducting qubit 104b; and/or at least one of improved fidelity, improved accuracy, or improved performance of a quantum processor comprising device 200a.

In the above embodiment, an entity as defined herein that implements device 200a can further drive (e.g., via a microwave pulse using one or more of the above defined external devices and/or computer 1012 as described above) superconducting bus resonator 102 detuned from its resonant frequency (e.g., 4 GHz) to generate and/or perform two-qubit entangling gates through an RIP gate. For example, in this embodiment, by driving superconducting bus resonator 102 detuned from its resonant frequency as described above, such an entity can entangle first superconducting qubit 104a and second superconducting qubit 104b (e.g., to produce an entanglement quantum gate between first superconducting qubit 104a and second superconducting qubit 104b). In this embodiment, such entanglement of first superconducting qubit 104a and second superconducting qubit 104b can enable a quantum gate operation to be performed between first superconducting qubit 104a and second superconducting qubit 104b. For example, in this embodiment, based on driving superconducting bus resonator 102 detuned from its resonant frequency, device 200a and/or superconducting bus resonator 102 can operate as an RIP gate, which can generate ZZ interactions between a first qubit (e.g., first superconducting qubit 104a) and a second qubit (e.g., second superconducting qubit 104b) that are present when there is a microwave drive (e.g., microwave pulse, microwave signal, control signal, etc.) at superconducting bus resonator 102 (e.g., when there is a microwave signal applied to superconducting bus resonator 102).

Figure 3:
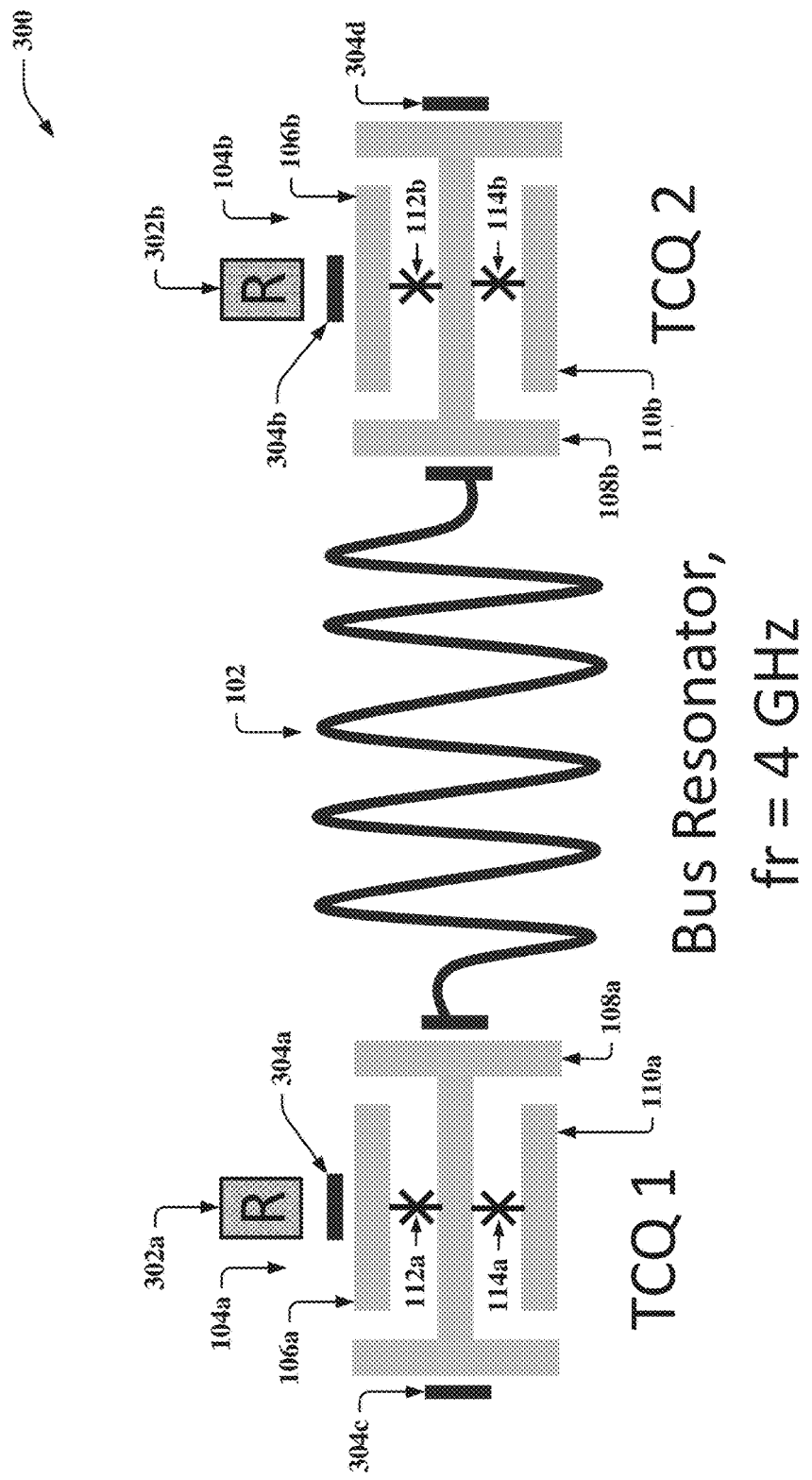
FIG. 3 illustrates a top view of an example, non-limiting device that can facilitate static ZZ suppression and Purcell loss reduction using mode-selective coupling in two-junction superconducting qubits in accordance with one or more embodiments described herein.

FIG. 3 illustrates a top view of an example, non-limiting device 300 that can facilitate static ZZ suppression and Purcell loss reduction using mode-selective coupling in two-junction superconducting qubits in accordance with one or more embodiments described herein. Repetitive description of like elements and/or processes employed in respective embodiments is omitted for sake of brevity.

Device 300 can comprise an example, non-limiting alternative embodiment of device 200a described above with reference to FIGS. 2A and 2B, where a first readout resonator 302a (denoted as R in FIG. 3) can be coupled to first superconducting qubit 104a and a second readout resonator 302b (denoted as R in FIG. 3) can be coupled to second superconducting qubit 104b. For instance, as illustrated in the example embodiment illustrated in FIG. 3, first readout resonator 302a can be coupled (e.g., capacitively coupled) to first superconducting pad 106a of first superconducting qubit 104a via a first coupling pad 304a of device 300 and second readout resonator 302b can be coupled (e.g., capacitively coupled) to first superconducting pad 106b of second superconducting qubit 104b via a second coupling pad 304b of device 300. In the example embodiment illustrated in FIG. 3, first readout resonator 302a and/or second readout resonator 302b can facilitate (e.g., via one or more of the above defined external devices and/or computer 1012 as described above with reference to FIGS. 1A-2B) readout of one or more types of information from device 300 (e.g., quantum information, qubit information, quantum state information, etc.).

As illustrated in the example embodiment depicted in FIG. 3, device 300 can further comprise a third coupling pad 304c and/or a fourth coupling pad 304d that can facilitate coupling (e.g., capacitive coupling) of one or more devices (not illustrated in the figures) to device 300 (e.g., coupling of one or more devices to second superconducting pad 108a of first superconducting qubit 104a and/or to second superconducting pad 108b of second superconducting qubit 104b). In various embodiments, first coupling pad 304a, second coupling pad 304b, third coupling pad 304c, and/or fourth coupling pad 304d can comprise a superconducting film (e.g., a superconducting metal film) that can be formed on a substrate (e.g., a silicon (Si) substrate, etc.) using one or more semiconductor and/or superconductor device fabrication techniques described above with reference to FIGS. 1A and 1B.

Figure 4:
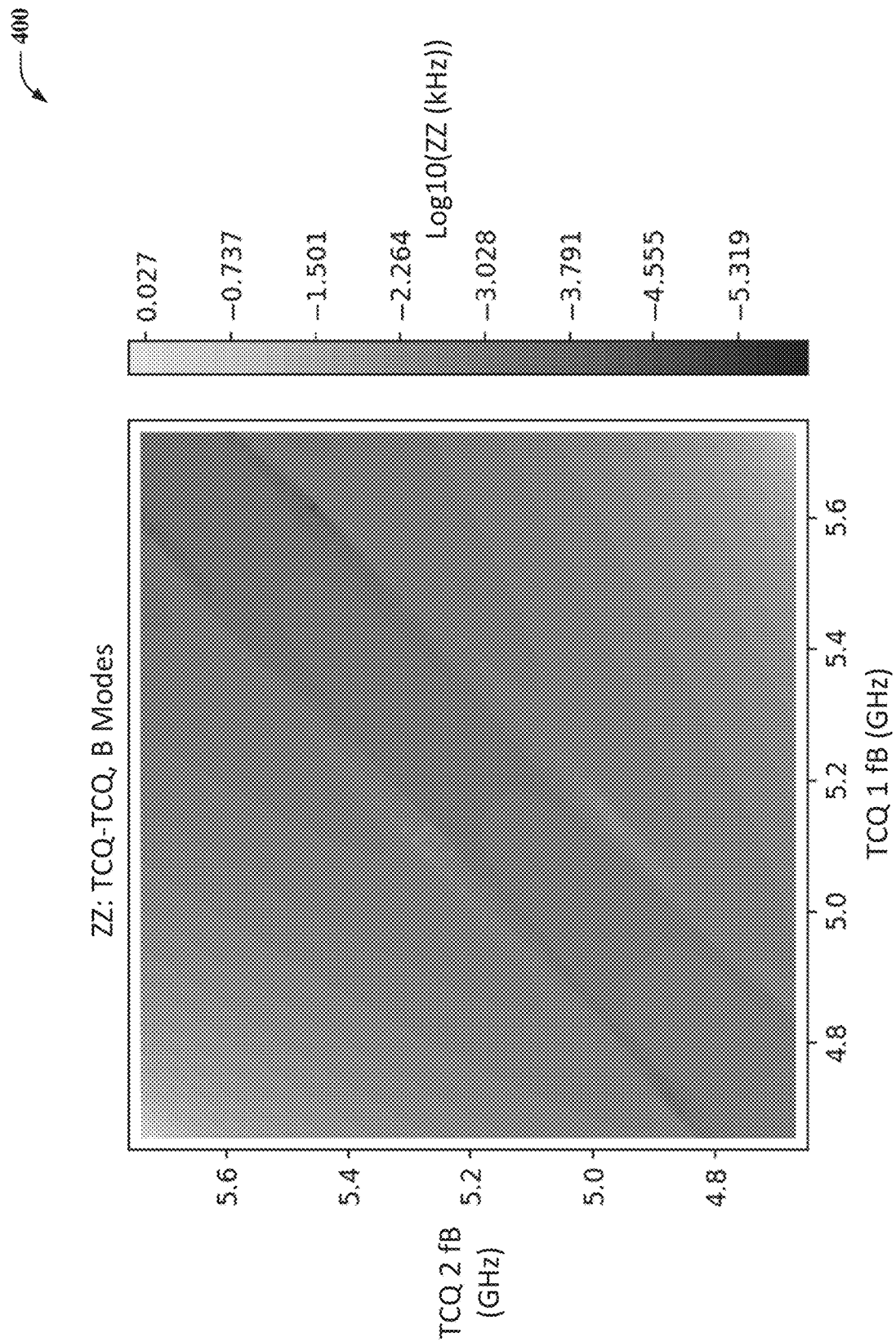
FIGS. 4, 5, and 6 illustrate example, non-limiting graphs that can facilitate static ZZ suppression and Purcell loss reduction using mode-selective coupling in two-junction superconducting qubits in accordance with one or more embodiments described herein.

FIG. 4 illustrates an example, non-limiting graph 400 that can facilitate static ZZ suppression and Purcell loss reduction using mode-selective coupling in two-junction superconducting qubits in accordance with one or more embodiments described herein. Repetitive description of like elements and/or processes employed in respective embodiments is omitted for sake of brevity.

Graph 400 can comprise results data yielded from implementing one or more embodiments of the subject disclosure described herein. For example, graph 400 can comprise results data yielded from implementing (e.g., simulating, quantizing, etc.) device 200a and/or device 300 in accordance with one or more embodiments of the subject disclosure described herein (e.g., computer-implemented methods 700, 800, and/or 900 described below with reference to FIGS. 7, 8, and 9, respectively).

In the example embodiment illustrated in FIG. 4, graph 400 can comprise a numerical simulation of the ZZ interactions (e.g., static ZZ interactions denoted as ZZ: TCQ-TCQ, B Modes in FIG. 4) between the second oscillating mode of first superconducting qubit 104a (denoted as TCQ 1 in FIG. 4) and the second oscillating mode of second superconducting qubit 104b (denoted as TCQ 2 in FIG. 4) as a function of the frequencies of first superconducting qubit 104a and second superconducting qubit 104b. In this example embodiment, graph 400 can comprise a numerical simulation of such ZZ interactions described above where quantum information (e.g., qubit information, quantum state information, etc.) can be encoded and/or stored in the second oscillating mode of first superconducting qubit 104a and second superconducting qubit 104b as described above with reference to FIGS. 2A and 2B (e.g., where the second oscillating mode comprises a data mode of first superconducting qubit 104a and second superconducting qubit 104b). In this example embodiment, graph 400 can comprise a numerical simulation of such ZZ interactions described above where superconducting bus resonator 102 can be coupled only to the first oscillating mode of first superconducting qubit 104a and second superconducting qubit 104b (e.g., coupled only to first oscillating mode structure 124a corresponding to the first oscillating mode of both first superconducting qubit 104a and second superconducting qubit 104b.).

As illustrated in the example embodiment of graph 400 depicted in FIG. 4: the frequencies of the second oscillating mode of first superconducting qubit 104a are expressed in gigahertz (GHz) and extend along the X-axis of graph 400 (denoted as TCQ 1 fB (GHz) in FIG. 4); the frequencies of the second oscillating mode of second superconducting qubit 104b are expressed in GHz and extend along the Y-axis of graph 400 (denoted as TCQ 2 fB (GHz) in FIG. 4); and the ZZ interaction frequencies are expressed in kilohertz (kHz), they are denoted as Log 10(ZZ (kHz)) in FIG. 4, and are represented by varying shades of gray in the Z-axis of graph 400 (e.g., the axis of graph 400 extending into and out of the page) that correspond with frequencies denoted in the ZZ legend illustrated in FIG. 4.

In the example embodiment illustrated in FIG. 4, graph 400 can comprise a numerical simulation of such ZZ interactions described above where the capacitance of capacitor 228a=the capacitance of capacitor 228b=10 femtofarads (fF) and the resonant frequency (fr) of superconducting bus resonator 102 is 4 GHz. In this example embodiment, graph 400 can comprise a numerical simulation of such ZZ interactions described above that can be obtained by varying (e.g., via one or more of the external devices defined above with reference to FIGS. 1A and 1B and/or computer 1012) critical currents of first superconducting qubit 104a and second superconducting qubit 104b from approximately 20 nanoamperes (nA) to approximately 30 nA, with 5 percent (%) asymmetry between a current I1 and a current I2 for each of first superconducting qubit 104a and second superconducting qubit 104b. As illustrated by graph 400 in FIG. 4, the ZZ interactions (e.g., static ZZ interactions) between the second oscillating mode of first superconducting qubit 104a and the second oscillating mode of second superconducting qubit 104b are less than 1 kHz when device 200a and/or device 300 is implemented in accordance with the above defined parameters, and therefore, it should be appreciated that such ZZ interactions are suppressed, cancelled, and/or effectively do not exist under such conditions.

Figure 5:
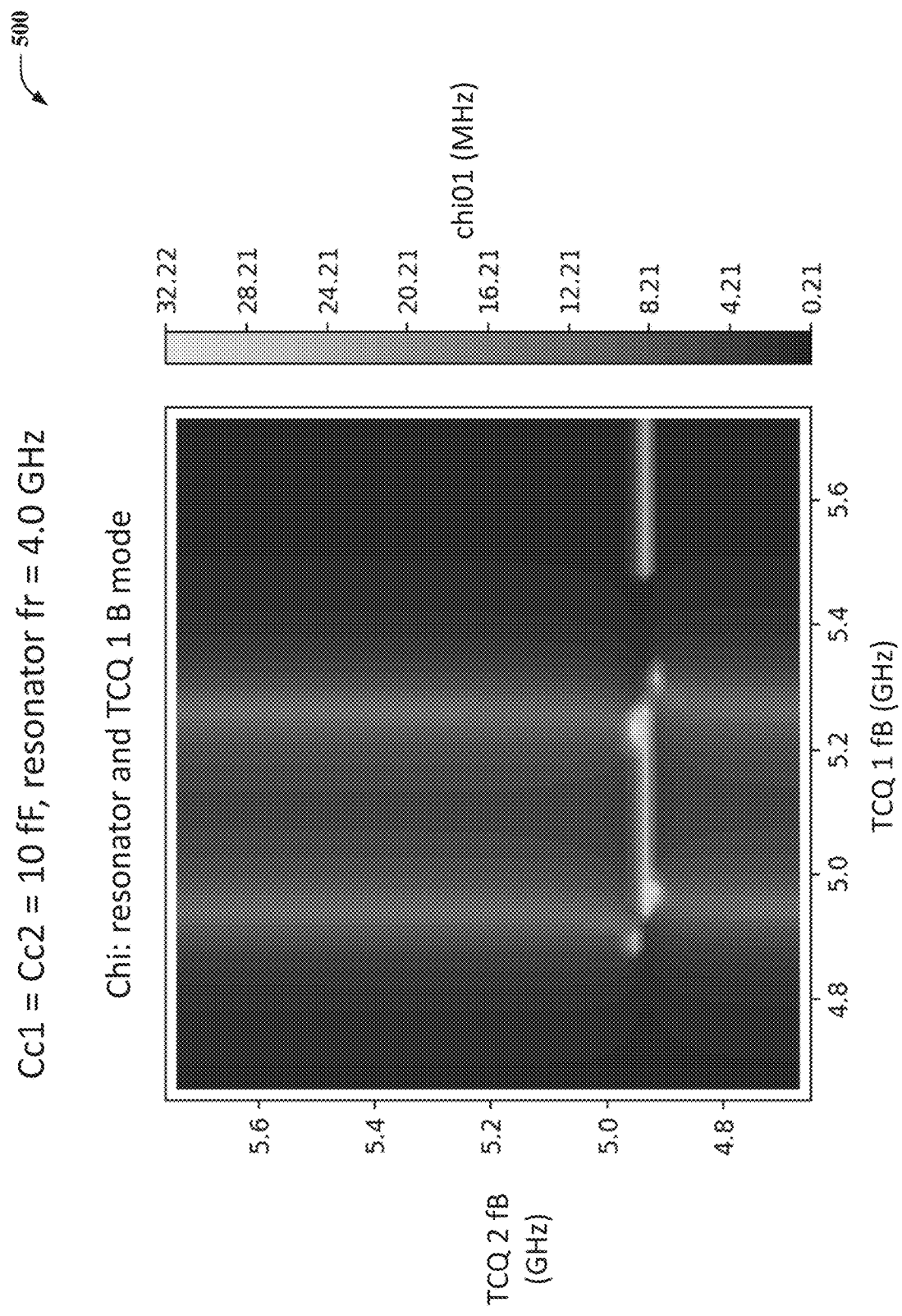

FIG. 5 illustrates an example, non-limiting graph 500 that can facilitate static ZZ suppression and Purcell loss reduction using mode-selective coupling in two-junction superconducting qubits in accordance with one or more embodiments described herein. Repetitive description of like elements and/or processes employed in respective embodiments is omitted for sake of brevity.

Graph 500 can comprise results data yielded from implementing one or more embodiments of the subject disclosure described herein. For example, graph 500 can comprise results data yielded from implementing (e.g., simulating, quantizing, etc.) device 200a and/or device 300 in accordance with one or more embodiments of the subject disclosure described herein (e.g., computer-implemented methods 700, 800, and/or 900 described below with reference to FIGS. 7, 8, and 9, respectively).

In the example embodiment illustrated in FIG. 5, graph 500 can comprise a numerical simulation of the above described net longitudinal coupling referred to as a chi shift (denoted as chi01 in FIG. 5) between superconducting bus resonator 102 and the second oscillating mode of first superconducting qubit 104a as a function of the frequencies of first superconducting qubit 104a and second superconducting qubit 104b. In this example embodiment, graph 500 can comprise a numerical simulation of such net longitudinal coupling (chi shift) described above where quantum information (e.g., qubit information, quantum state information, etc.) can be encoded and/or stored in the second oscillating mode of first superconducting qubit 104a and second superconducting qubit 104b as described above with reference to FIGS. 2A and 2B (e.g., where the second oscillating mode comprises a data mode of first superconducting qubit 104a and second superconducting qubit 104b). In this example embodiment, graph 500 can comprise a numerical simulation of such net longitudinal coupling (chi shift) described above where superconducting bus resonator 102 can be coupled only to the first oscillating mode of first superconducting qubit 104a and second superconducting qubit 104b (e.g., coupled only to first oscillating mode structure 124a corresponding to the first oscillating mode of both first superconducting qubit 104a and second superconducting qubit 104b.).

As illustrated in the example embodiment of graph 500 depicted in FIG. 5: the frequencies of the second oscillating mode of first superconducting qubit 104a are expressed in GHz and extend along the X-axis of graph 500 (denoted as TCQ 1 fB (GHz) in FIG. 5); the frequencies of the second oscillating mode of second superconducting qubit 104b are expressed in GHz and extend along the Y-axis of graph 500 (denoted as TCQ 2 fB (GHz) in FIG. 5); and the net longitudinal coupling (chi shift) frequencies are expressed in megahertz (MHz), they are denoted as chi01 (MHz) in FIG. 5, and are represented by varying shades of gray in the Z-axis of graph 500 (e.g., the axis of graph 500 extending into and out of the page) that correspond with frequencies denoted in the chi01 legend illustrated in FIG. 5.

In the example embodiment illustrated in FIG. 5, graph 500 can comprise a numerical simulation of such net longitudinal coupling (chi shift) described above where the capacitance of capacitor 228a=the capacitance of capacitor 228b=10 fF and the resonant frequency (fr) of superconducting bus resonator 102 is 4 GHz. In this example embodiment, graph 500 can comprise a numerical simulation of such net longitudinal coupling (chi shift) described above that can be obtained by varying (e.g., via one or more of the external devices defined above with reference to FIGS. 1A and 1B and/or computer 1012) critical currents of first superconducting qubit 104a and second superconducting qubit 104b from approximately 20 nA to approximately 30 nA, with 5 percent (%) asymmetry between a current I1 and a current I2 for each of first superconducting qubit 104a and second superconducting qubit 104b. As described above with reference to FIGS. 2A and 2B and as illustrated by graph 500 in FIG. 5, although device 200a and/or device 300 can prevent exchange coupling between superconducting bus resonator 102 and the second oscillating mode of first superconducting qubit 104a and second superconducting qubit 104b, device 200a and/or device 300 can enable a large (e.g., relatively large) net longitudinal coupling (chi shift) between superconducting bus resonator 102 and the second oscillating mode of first superconducting qubit 104a.

Figure 6:
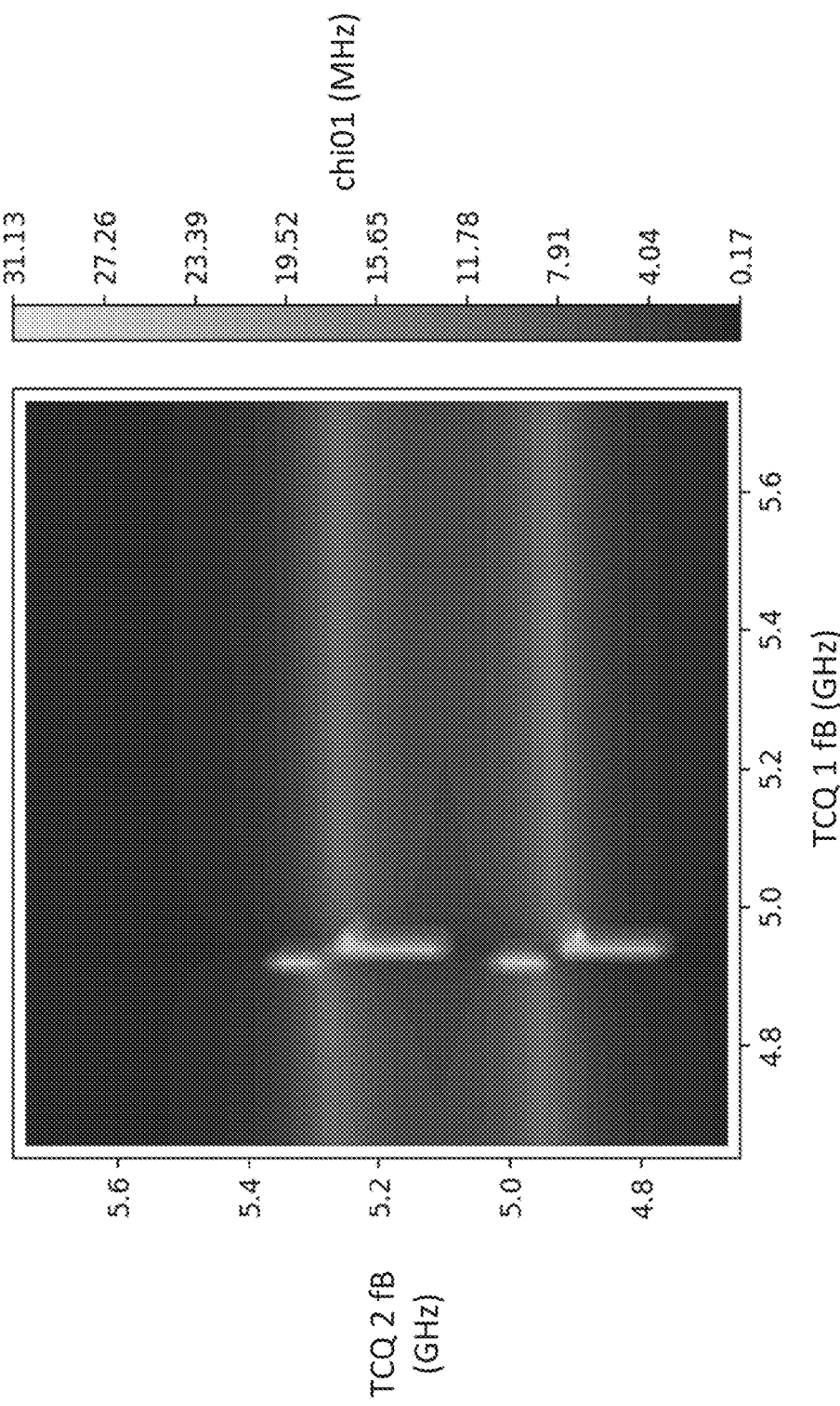

FIG. 6 illustrates an example, non-limiting graph 600 that can facilitate static ZZ suppression and Purcell loss reduction using mode-selective coupling in two-junction superconducting qubits in accordance with one or more embodiments described herein. Repetitive description of like elements and/or processes employed in respective embodiments is omitted for sake of brevity.

Graph 600 can comprise results data yielded from implementing one or more embodiments of the subject disclosure described herein. For example, graph 600 can comprise results data yielded from implementing (e.g., simulating, quantizing, etc.) device 200a and/or device 300 in accordance with one or more embodiments of the subject disclosure described herein (e.g., computer-implemented methods 700, 800, and/or 900 described below with reference to FIGS. 7, 8, and 9, respectively).

In the example embodiment illustrated in FIG. 6, graph 600 can comprise a numerical simulation of the above described net longitudinal coupling referred to as a chi shift (denoted as chi01 in FIG. 6) between superconducting bus resonator 102 and the second oscillating mode of second superconducting qubit 104b as a function of the frequencies of first superconducting qubit 104a and second superconducting qubit 104b. In this example embodiment, graph 600 can comprise a numerical simulation of such net longitudinal coupling (chi shift) described above where quantum information (e.g., qubit information, quantum state information, etc.) can be encoded and/or stored in the second oscillating mode of first superconducting qubit 104a and second superconducting qubit 104b as described above with reference to FIGS. 2A and 2B (e.g., where the second oscillating mode comprises a data mode of first superconducting qubit 104a and second superconducting qubit 104b). In this example embodiment, graph 600 can comprise a numerical simulation of such net longitudinal coupling (chi shift) described above where superconducting bus resonator 102 can be coupled only to the first oscillating mode of first superconducting qubit 104a and second superconducting qubit 104b (e.g., coupled only to first oscillating mode structure 124a corresponding to the first oscillating mode of both first superconducting qubit 104a and second superconducting qubit 104b.).

As illustrated in the example embodiment of graph 600 depicted in FIG. 6: the frequencies of the second oscillating mode of first superconducting qubit 104a are expressed in GHz and extend along the X-axis of graph 600 (denoted as TCQ 1 fB (GHz) in FIG. 6); the frequencies of the second oscillating mode of second superconducting qubit 104b are expressed in GHz and extend along the Y-axis of graph 600 (denoted as TCQ 2 fB (GHz) in FIG. 6); and the net longitudinal coupling (chi shift) frequencies are expressed in megahertz (MHz), they are denoted as chi01 (MHz) in FIG. 6, and are represented by varying shades of gray in the Z-axis of graph 600 (e.g., the axis of graph 600 extending into and out of the page) that correspond with frequencies denoted in the chi01 legend illustrated in FIG. 6.

In the example embodiment illustrated in FIG. 6, graph 600 can comprise a numerical simulation of such net longitudinal coupling (chi shift) described above where the capacitance of capacitor 228a=the capacitance of capacitor 228b=10 fF and the resonant frequency (fr) of superconducting bus resonator 102 is 4 GHz. In this example embodiment, graph 600 can comprise a numerical simulation of such net longitudinal coupling (chi shift) described above that can be obtained by varying (e.g., via one or more of the external devices defined above with reference to FIGS. 1A and 1B and/or computer 1012) critical currents of first superconducting qubit 104a and second superconducting qubit 104b from approximately 20 nA to approximately 30 nA, with 5 percent (%) asymmetry between a current I1 and a current I2 for each of first superconducting qubit 104a and second superconducting qubit 104b. As described above with reference to FIGS. 2A and 2B and as illustrated by graph 600 in FIG. 6, although device 200a and/or device 300 can prevent exchange coupling between superconducting bus resonator 102 and the second oscillating mode of first superconducting qubit 104a and second superconducting qubit 104b, device 200a and/or device 300 can enable a large (e.g., relatively large) net longitudinal coupling (chi shift) between superconducting bus resonator 102 and the second oscillating mode of second superconducting qubit 104b.

The various embodiments of the subject disclosure described herein (e.g., device 100a, device 200a, device 300, etc.) can be associated with various technologies. For example, the various embodiments of the subject disclosure described herein (e.g., device 100a, device 200a, device 300, etc.) can be associated with quantum computing technologies, quantum gate technologies, quantum coupler technologies, quantum hardware and/or software technologies, quantum circuit technologies, superconducting circuit technologies, machine learning technologies, artificial intelligence technologies, cloud computing technologies, and/or other technologies.

The various embodiments of the subject disclosure described herein (e.g., device 100a, device 200a, device 300, etc.) can provide technical improvements to systems, devices, components, operational steps, and/or processing steps associated with the various technologies identified above. For example, the various embodiments of the subject disclosure described herein (e.g., device 100a, device 200a, device 300, etc.) can encode quantum information in a first oscillating mode of a first superconducting qubit and a second superconducting qubit; and/or couple a superconducting bus resonator to an oscillating mode structure corresponding to a second oscillating mode of the first superconducting qubit and the second superconducting qubit.

In the above example and with reference to the example embodiment described above and illustrated in FIGS. 1A and 1B, based on realizing the above described mode-selective coupling scheme, device 100a of the subject disclosure described herein can facilitate suppression (e.g., cancellation, reduction, etc.) of direct interactions such as, for example, exchange interactions and/or static ZZ interactions between first superconducting qubit 104a and second superconducting qubit 104b (e.g., between the first oscillating mode of first superconducting qubit 104a and the first oscillating mode of second superconducting qubit 104b, where the first oscillating mode and the second oscillating mode can comprise data modes of first superconducting qubit 104a and second superconducting qubit 104b). In this example, based on realizing the above described mode-selective coupling scheme, device 100a can also facilitate strong (e.g., relatively strong) longitudinal coupling between the first oscillating mode and the second oscillating mode (e.g., between first oscillating mode structure 124a and second oscillating mode structure 124b) of first superconducting qubit 104a and second superconducting qubit 104b. In this example, based on realizing the above described mode-selective coupling scheme, device 100a can further facilitate prevention of exchange coupling between the data modes (e.g., between the first oscillating mode and the second oscillating mode) and superconducting bus resonator 102, which can reduce energy loss (e.g., Purcell loss) and/or decoherence associated with device 100a and/or superconducting bus resonator 102. In this example, based on such suppression of such static ZZ interactions, reduced energy loss, and/or reduced decoherence associated with superconducting bus resonator 102, device 100a can thereby facilitate: reduced quantum gate errors associated with first superconducting qubit 104a and/or second superconducting qubit 104b; increased speed of a quantum gate comprising first superconducting qubit 104a and second superconducting qubit 104b; and/or at least one of improved fidelity, improved accuracy, or improved performance of a quantum processor comprising device 100a.

The various embodiments of the subject disclosure described herein (e.g., device 100a, device 200a, device 300, etc.) can provide technical improvements to a processing unit (e.g., a quantum processor comprising device 100a, device 200a, or device 300, processing unit 1014, etc.) associated with a classical computing device and/or a quantum computing device (e.g., a quantum processor, quantum hardware, superconducting circuit, etc.) that can be associated with one or more of the various embodiments of the subject disclosure described herein (e.g., device 100a, device 200a, device 300, etc.). For example, by realizing the above described mode-selective coupling scheme, device 100a can facilitate such suppression of such static ZZ interactions, reduced energy loss, and/or reduced decoherence associated with superconducting bus resonator 102. In this example, by suppressing such ZZ interactions, reducing such energy loss, and/or reducing such decoherence associated with superconducting bus resonator 102, device 100a can thereby facilitate: reduced quantum gate errors associated with first superconducting qubit 104a and/or second superconducting qubit 104b; and/or increased speed of a quantum gate (e.g., an entangling quantum gate) comprising first superconducting qubit 104a and second superconducting qubit 104b. In this example, by reducing such quantum gate errors and/or increasing the speed of such a quantum gate, device 100a can facilitate improved fidelity, improved accuracy, and/or improved performance of a quantum processor comprising device 100a.

Based on such suppression of ZZ interactions between the first oscillating mode of first superconducting qubit 104a and the first oscillating mode of second superconducting qubit 104b as described above, a practical application of one or more embodiments of the subject disclosure described herein (e.g., device 100a, device 200a, device 300, etc.) is that they can be implemented in a quantum device (e.g., a quantum processor, a quantum computer, etc.) to more quickly and more efficiently compute, with improved fidelity and/or accuracy, one or more solutions (e.g., heuristic(s), etc.) to a variety of problems ranging in complexity (e.g., an estimation problem, an optimization problem, etc.) in a variety of domains (e.g., finance, chemistry, medicine, etc.). For example, based on such suppression of ZZ interactions between the first oscillating mode of first superconducting qubit 104a and the first oscillating mode of second superconducting qubit 104b as described above, a practical application of one or more embodiments of the subject disclosure described herein (e.g., device 100a, etc.) is that they can be implemented in, for instance, a quantum processor (e.g., a quantum processor comprising device 100a) to compute, with improved fidelity and/or accuracy, one or more solutions (e.g., heuristic(s), etc.) to an optimization problem in the domain of chemistry, medicine, and/or finance, where such a solution can be used to engineer, for instance, a new chemical compound, a new medication, and/or a new options pricing system and/or method.

It should be appreciated that the various embodiments of the subject disclosure described herein (e.g., device 100a, device 200a, device 300, etc.) provide a new approach driven by relatively new quantum computing technologies. For example, one or more embodiments of the subject disclosure described herein (e.g., device 100a, etc.) provide a new approach to suppress ZZ interactions between the first oscillating mode of first superconducting qubit 104a and the first oscillating mode of second superconducting qubit 104b as described above that result in quantum gate errors during quantum computations. In this example, such a new approach to suppress ZZ interactions can enable faster and more efficient quantum computations with improved fidelity and/or accuracy using a quantum processor comprising one or more of the various embodiments of the subject disclosure described herein (e.g., device 100a, etc.).

The various embodiments of the subject disclosure described herein (e.g., device 100a, device 200a, device 300, etc.) can employ hardware or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, etc.) to execute defined tasks related to the various technologies identified above. The various embodiments of the subject disclosure described herein (e.g., device 100a, device 200a, device 300, etc.) can be employed to solve new problems that arise through advancements in technologies mentioned above, employment of quantum computing systems, cloud computing systems, computer architecture, and/or another technology.

It is to be appreciated that the various embodiments of the subject disclosure described herein (e.g., device 100a, device 200a, device 300, etc.) can utilize various combinations of electrical components, mechanical components, and circuitry that cannot be replicated in the mind of a human or performed by a human, as the various operations that can be executed by the various embodiments of the subject disclosure described herein (e.g., device 100a, device 200a, device 300, etc.) are operations that are greater than the capability of a human mind. For instance, the amount of data processed, the speed of processing such data, or the types of data processed by the various embodiments of the subject disclosure described herein (e.g., device 100a, device 200a, device 300, etc.) over a certain period of time can be greater, faster, or different than the amount, speed, or data type that can be processed by a human mind over the same period of time.

According to several embodiments, the various embodiments of the subject disclosure described herein (e.g., device 100a, device 200a, device 300, etc.) can also be fully operational towards performing one or more other functions (e.g., fully powered on, fully executed, etc.) while also performing the various operations described herein. It should be appreciated that such simultaneous multi-operational execution is beyond the capability of a human mind. It should also be appreciated that the various embodiments of the subject disclosure described herein (e.g., device 100a, device 200a, device 300, etc.) can include information that is impossible to obtain manually by an entity, such as a human user. For example, the type, amount, and/or variety of information included in device 100a, device 200a, and/or device 300 can be more complex than information obtained manually by a human user.

Figure 7:
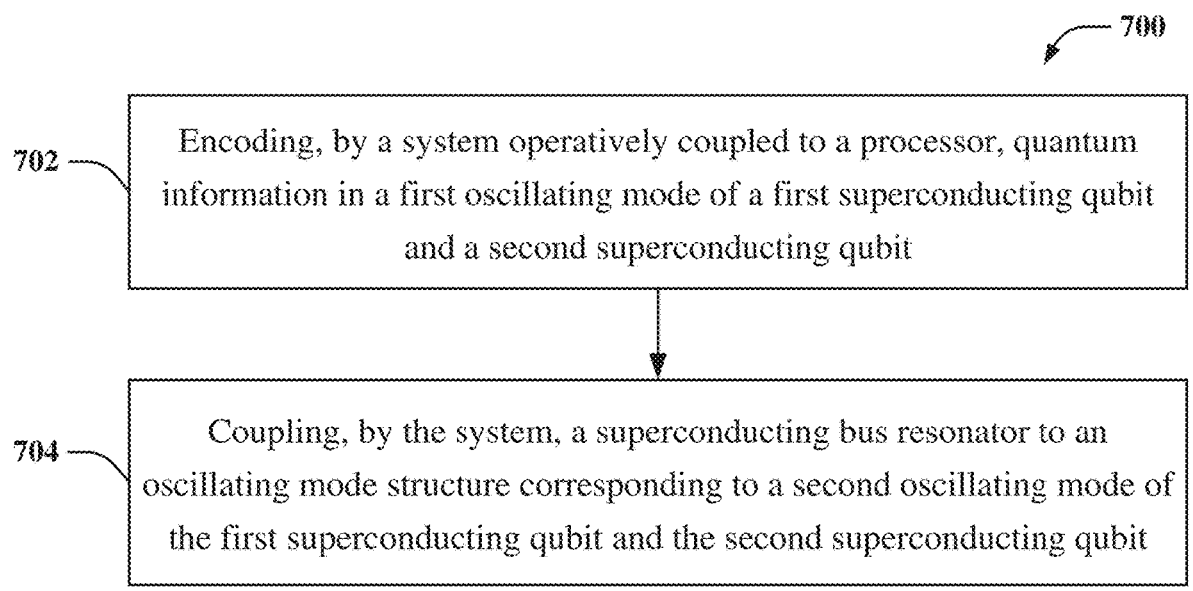
FIGS. 7, 8, and 9 illustrate flow diagrams of example, non-limiting computer-implemented methods that can facilitate static ZZ suppression and Purcell loss reduction using mode-selective coupling in two-junction superconducting qubits in accordance with one or more embodiments described herein.

FIG. 7 illustrates a flow diagram of an example, non-limiting computer-implemented method 700 that can facilitate static ZZ suppression and Purcell loss reduction using mode-selective coupling in two-junction superconducting qubits in accordance with one or more embodiments described herein. Repetitive description of like elements and/or processes employed in respective embodiments is omitted for sake of brevity.

At 702, computer-implemented method 700 can comprise encoding, by a system (e.g., a system comprising device 100a, computer 1012, and/or one or more types of the external device defined above with reference to FIGS. 1A and 1B) operatively coupled to a processor (e.g., processing unit 1014, etc.), quantum information (e.g., qubit information, quantum state information, etc.) in a first oscillating mode (e.g., the first oscillating mode described above with reference to FIGS. 1A and 1B) of a first superconducting qubit (e.g., first superconducting qubit 104a) and a second superconducting qubit (e.g., second superconducting qubit 104b).

At 704, computer-implemented method 700 can comprise coupling, by the system (e.g., a system comprising device 100a, computer 1012, and/or one or more types of the external device defined above with reference to FIGS. 1A and 1B), a superconducting bus resonator (e.g., superconducting bus resonator 102) to an oscillating mode structure (e.g., second oscillating mode structure 124b) corresponding to a second oscillating mode (e.g., the second oscillating mode described above with reference to FIGS. 1A and 1B) of the first superconducting qubit and the second superconducting qubit.

Figure 8:
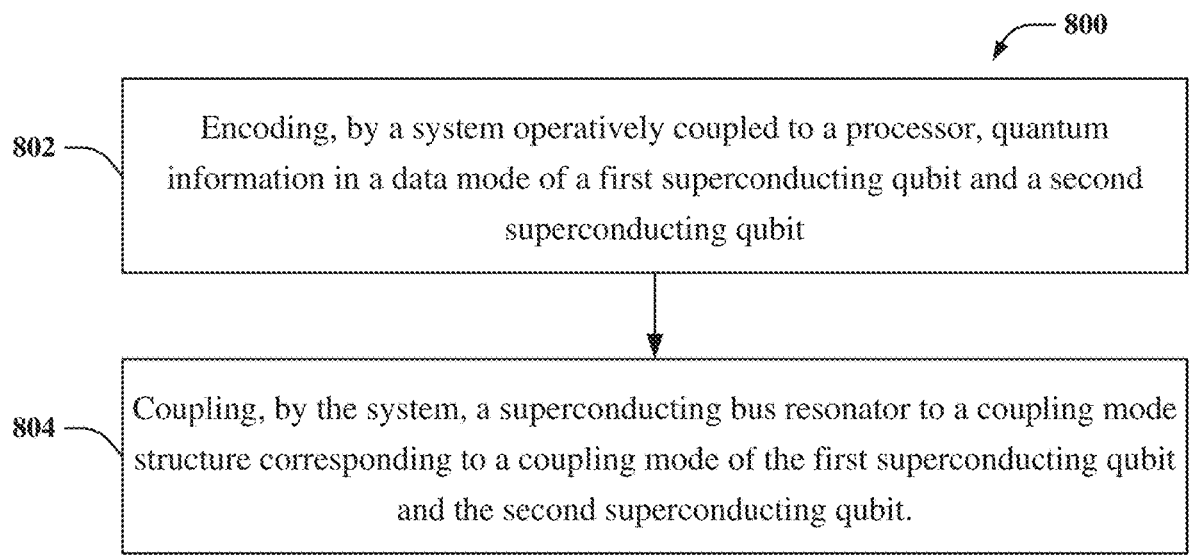

FIG. 8 illustrates a flow diagram of an example, non-limiting computer-implemented method 800 that can facilitate static ZZ suppression and Purcell loss reduction using mode-selective coupling in two-junction superconducting qubits in accordance with one or more embodiments described herein. Repetitive description of like elements and/or processes employed in respective embodiments is omitted for sake of brevity.

At 802, computer-implemented method 800 can comprise encoding, by a system (e.g., a system comprising device 100a, computer 1012, and/or one or more types of the external device defined above with reference to FIGS. 1A and 1B) operatively coupled to a processor (e.g., processing unit 1014, etc.), quantum information (e.g., qubit information, quantum state information, etc.) in a data mode (e.g., the first oscillating mode described above with reference to FIGS. 1A and 1B) of a first superconducting qubit (e.g., first superconducting qubit 104a) and a second superconducting qubit (e.g., second superconducting qubit 104b).

At 804, computer-implemented method 800 can comprise coupling, by the system (e.g., a system comprising device 100a, computer 1012, and/or one or more types of the external device defined above with reference to FIGS. 1A and 1B), a superconducting bus resonator (e.g., superconducting bus resonator 102) to a coupling mode structure (e.g., second oscillating mode structure 124b) corresponding to a coupling mode (e.g., the second oscillating mode described above with reference to FIGS. 1A and 1B) of the first superconducting qubit and the second superconducting qubit.

Figure 9:
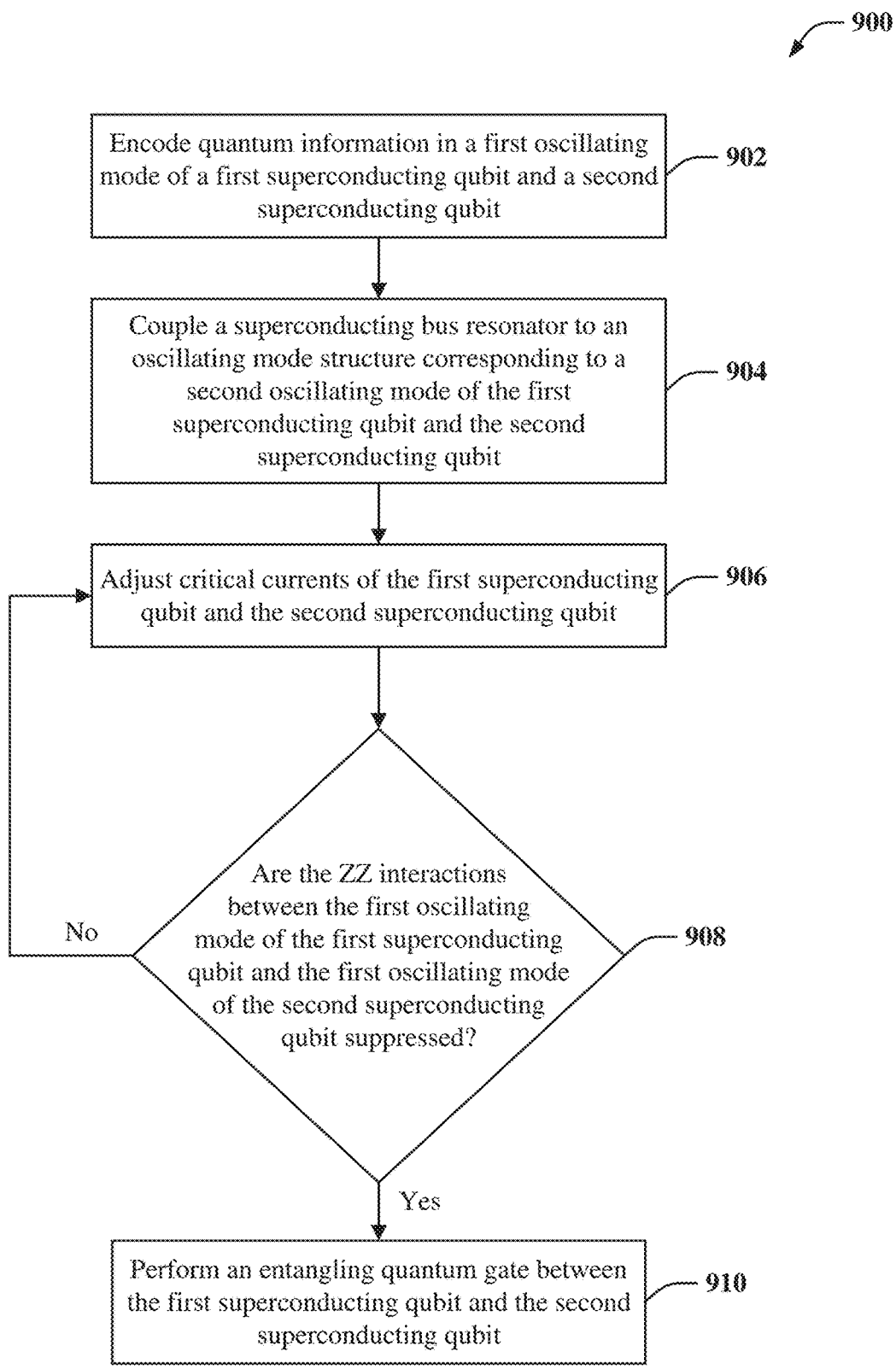

FIG. 9 illustrates a flow diagram of an example, non-limiting computer-implemented method 900 that can facilitate static ZZ suppression and Purcell loss reduction using mode-selective coupling in two-junction superconducting qubits in accordance with one or more embodiments described herein. Repetitive description of like elements and/or processes employed in respective embodiments is omitted for sake of brevity.

At 902, computer-implemented method 900 can comprise encoding (e.g., via a system comprising device 200a or device 300, computer 1012, and/or one or more types of the external device defined above with reference to FIGS. 1A and 1B) quantum information (e.g., qubit information, quantum state information, etc.) in a first oscillating mode (e.g., the first oscillating mode described above with reference to FIGS. 1A and 1B) of a first superconducting qubit (e.g., first superconducting qubit 104a) and a second superconducting qubit (e.g., second superconducting qubit 104b).

At 904, computer-implemented method 900 can comprise coupling (e.g., via a system comprising device 200a or device 300, computer 1012, and/or one or more types of the external device defined above with reference to FIGS. 1A and 1B) a superconducting bus resonator (e.g., superconducting bus resonator 102) to an oscillating mode structure (e.g., second oscillating mode structure 124b) corresponding to a second oscillating mode (e.g., the second oscillating mode described above with reference to FIGS. 1A and 1B) of the first superconducting qubit and the second superconducting qubit.

At 906, computer-implemented method 900 can comprise adjusting (e.g., via a system comprising device 200a or device 300, computer 1012, and/or one or more types of the external device defined above with reference to FIGS. 1A and 1B) critical currents of the first superconducting qubit and the second superconducting qubit. For example, as described above with reference to FIGS. 1A, 1B, 2A, 2B, and 4, an entity as defined herein that implements device 200a and/or device 300 can set the capacitance of capacitor 228a=the capacitance of capacitor 228b=10 femtofarads (fF), where the resonant frequency (fr) of superconducting bus resonator 102 is 4 GHz. In this example, such an entity can adjust and/or vary (e.g., via one or more of the external devices defined above with reference to FIGS. 1A and 1B and/or computer 1012) critical currents of first superconducting qubit 104a and second superconducting qubit 104b from approximately 20 nA to approximately 30 nA, with 5 percent (%) asymmetry between a current I1 and a current I2 for each of first superconducting qubit 104a and second superconducting qubit 104b.

At 908, computer-implemented method 900 can comprise determining (e.g., via a system comprising an entity as defined herein, device 200a or device 300, computer 1012, and/or one or more types of the external device defined above with reference to FIGS. 1A and 1B) whether the ZZ interactions (e.g., static ZZ interactions) between the first oscillating mode of the first superconducting qubit and the first oscillating mode of the second superconducting qubit are suppressed. For instance, with reference to the example described above at operation 906, such an entity that implements device 200a and/or device 300 in accordance with the above defined parameters can use graph 400 to determine whether the ZZ interactions (e.g., static ZZ interactions) between the second oscillating mode of first superconducting qubit 104a and the second oscillating mode of second superconducting qubit 104b are suppressed. In this example, such an entity can use graph 400 to determine whether the ZZ interactions (e.g., static ZZ interactions) between the second oscillating mode of first superconducting qubit 104a and the second oscillating mode of second superconducting qubit 104b are less than 1 kHz when device 200a and/or device 300 is implemented in accordance with the above defined parameters. In this example, it should be appreciated that such ZZ interactions having frequency values that are less than 1 kHz are suppressed, cancelled, and/or effectively do not exist when device 200a and/or device 300 are implemented in accordance with such parameters defined above.

If it is determined at 908 that the ZZ interactions (e.g., static ZZ interactions) between the first oscillating mode of the first superconducting qubit and the first oscillating mode of the second superconducting qubit are suppressed, at 910, computer-implemented method 900 can comprise performing (e.g., via a system comprising device 200a or device 300, computer 1012, and/or one or more types of the external device defined above with reference to FIGS. 1A and 1B) an entangling quantum gate between the first superconducting qubit and the second superconducting qubit. For example, as described above with reference to FIGS. 2A and 2B, an entity as defined herein that implements device 200a can drive (e.g., via a microwave pulse using one or more of the external devices defined herein and/or computer 1012 as described above) superconducting bus resonator 102 detuned from its resonant frequency (e.g., 4 GHz) to generate and/or perform two-qubit entangling gates (e.g., two-qubit entangling quantum gates) through an RIP gate. In this example, by driving superconducting bus resonator 102 detuned from its resonant frequency as described above, such an entity can entangle first superconducting qubit 104a and second superconducting qubit 104b (e.g., to produce an entanglement quantum gate between first superconducting qubit 104a and second superconducting qubit 104b). In this example, such entanglement of first superconducting qubit 104a and second superconducting qubit 104b can enable an entangling quantum gate operation to be performed between first superconducting qubit 104a and second superconducting qubit 104b.

If it is determined at 908 that the ZZ interactions (e.g., static ZZ interactions) between the first oscillating mode of the first superconducting qubit and the first oscillating mode of the second superconducting qubit are suppressed, computer-implemented method 900 can comprise returning to operation 906 to adjust the critical current of the first superconducting qubit and second superconducting qubit. In various embodiments, operations 906 and 908 of computer-implemented method 900 can be repeated until the ZZ interactions between the first oscillating mode of the first superconducting qubit and the first oscillating mode of the second superconducting qubit are suppressed (e.g., less than 1 kHz). In these embodiments, based on repeating operations 906 and 906 until the ZZ interactions between the first oscillating mode of the first superconducting qubit and the first oscillating mode of the second superconducting qubit are suppressed, computer-implemented method 900 can proceed to operation 910.

Figure 10:
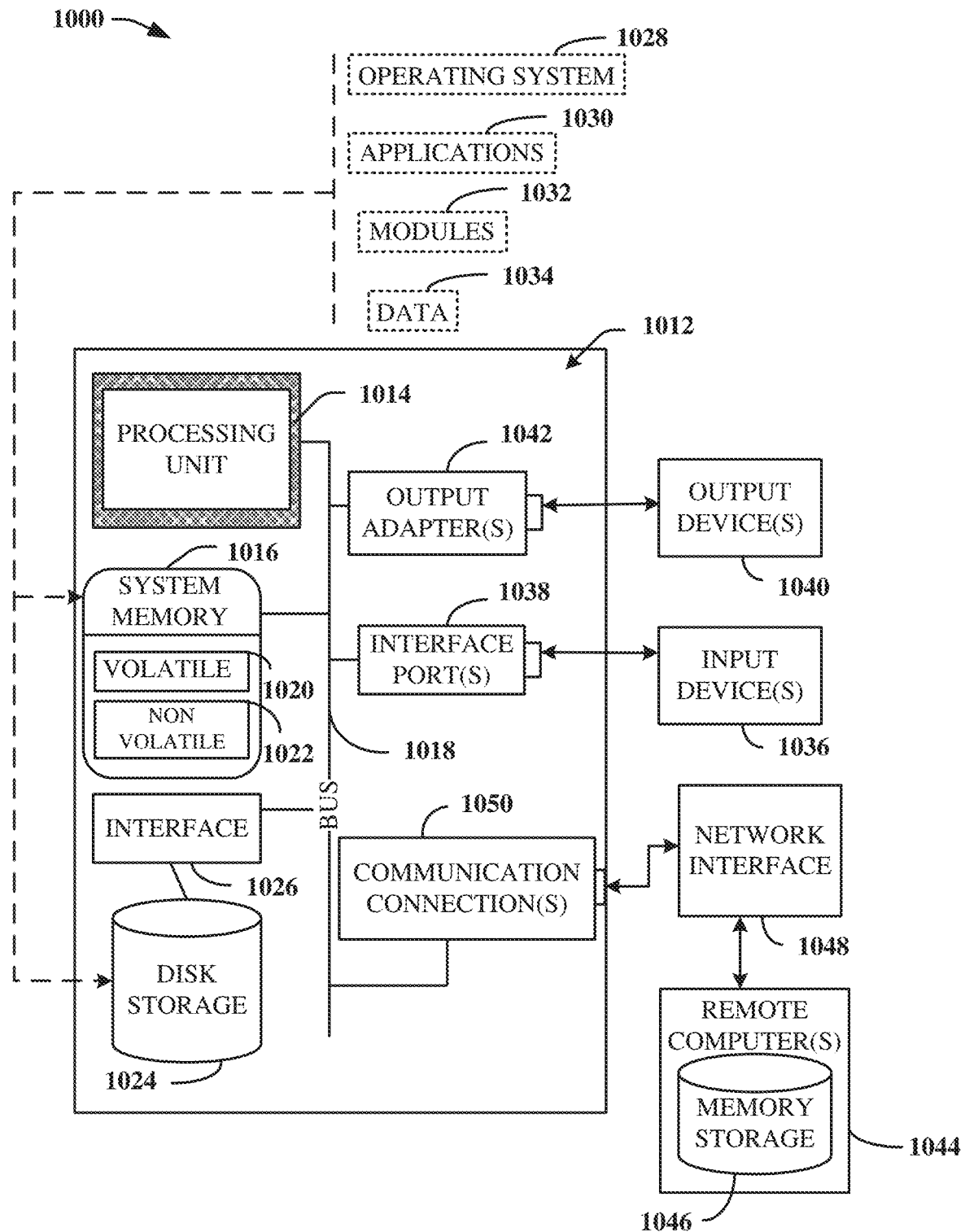
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. For example, as described below, operating environment 1000 can be used to implement the example, non-limiting multi-step fabrication sequences described above with reference to FIGS. 1A and 1B that can be implemented to fabricate device 100a, 200a, and/or 300 in accordance with one or more embodiments of the subject disclosure as described herein. In another example, as described below, operating environment 1000 can be used to implement one or more of the example, non-limiting computer-implemented methods 700, 800, and/or 900 described above with reference to FIGS. 7, 8, and 9, respectively. Repetitive description of like elements and/or processes employed in other embodiments described herein is omitted for sake of brevity.

The example, non-limiting multi-step fabrication sequences described above with reference to FIGS. 1A and 1B, which can be implemented to fabricate device 100*a*, 200*a*, and/or 300, can be implemented by a computing system (e.g., operating environment 1000 illustrated in FIG. 10 and described below) and/or a computing device (e.g., computer 1012 illustrated in FIG. 10 and described below). In non-limiting example embodiments, such computing system (e.g., operating environment 1000) and/or such computing device (e.g., computer 1012) can comprise one or more processors and one or more memory devices that can store executable instructions thereon that, when executed by the one or more processors, can facilitate performance of the example, non-limiting multi-step fabrication sequences described above with reference to FIGS. 1A and 1B. As a non-limiting example, the one or more processors can facilitate performance of the example, non-limiting multi-step fabrication sequences described above with reference to FIGS. 1A and 1B by directing and/or controlling one or more systems and/or equipment operable to perform semiconductor and/or superconductor device fabrication.

In another example, one or more of the example, non-limiting computer-implemented methods 700, 800, and/or 900 described above with reference to FIGS. 7, 8, and 9, respectively, can also be implemented (e.g., executed) by operating environment 1000. As a non-limiting example, the one or more processors of such a computing device (e.g., computer 1012) can facilitate performance of one or more of the example, non-limiting computer implemented methods 700, 800, and/or 900 described above with reference to FIGS. 7, 8, and 9, respectively, by directing and/or controlling one or more systems and/or equipment (e.g., one or more of the external devices defined above with reference to FIGS. 1A and 1B, etc.) operable to perform the operations and/or routines of such computer-implemented method(s).

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
  encoding, by a system operatively coupled to a processor, quantum information in a first oscillating mode of a first superconducting qubit and a second superconducting qubit; and
  coupling, by the system, a superconducting bus resonator to an oscillating mode structure corresponding to a second oscillating mode of the first superconducting qubit and the second superconducting qubit.

2. The computer-implemented method of claim 1, wherein the first superconducting qubit operates in the first oscillating mode and the second oscillating mode.

3. The computer-implemented method of claim 1, wherein the second superconducting qubit operates in the first oscillating mode and the second oscillating mode.

4. The computer-implemented method of claim 1, wherein at least one of the first superconducting qubit or the second superconducting qubit comprises at least one of a tunable coupler qubit, a two junction qubit, a multimode qubit, a multimode two junction qubit, or a tunable qubit.

5. The computer-implemented method of claim 1, further comprising:
  encoding, by the system, the quantum information in the first oscillating mode of the first superconducting qubit and the second superconducting qubit; and
  coupling, by the system, the superconducting bus resonator to the oscillating mode structure corresponding to the second oscillating mode of the first superconducting qubit and the second superconducting qubit to suppress ZZ interactions between the first superconducting qubit and the second superconducting qubit and to reduce energy loss associated with the superconducting bus resonator, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the first superconducting qubit, the second superconducting qubit, and the superconducting bus resonator.

6. A computer-implemented method, comprising:
  encoding, by a system operatively coupled to a processor, quantum information in a data mode of a first superconducting qubit and a second superconducting qubit; and
  coupling, by the system, a superconducting bus resonator to a coupling mode structure corresponding to a coupling mode of the first superconducting qubit and the second superconducting qubit.

7. The computer-implemented method of claim 6, wherein the first superconducting qubit operates in the data mode and the coupling mode.

8. The computer-implemented method of claim 6, wherein the second superconducting qubit operates in the data mode and the coupling mode.

9. The computer-implemented method of claim 6, wherein at least one of the first superconducting qubit or the second superconducting qubit comprises at least one of a tunable coupler qubit, a two junction qubit, a multimode qubit, a multimode two junction qubit, or a tunable qubit.

10. The computer-implemented method of claim 6, further comprising:
  encoding, by the system, the quantum information in the data mode of the first superconducting qubit and the second superconducting qubit; and
  coupling, by the system, the superconducting bus resonator to the coupling mode structure corresponding to the coupling mode of the first superconducting qubit and the second superconducting qubit to suppress ZZ interactions between the first superconducting qubit and the second superconducting qubit and to reduce energy loss associated with the superconducting bus resonator, thereby facilitating at least one of: reduced quantum gate errors associated with at least one of the first superconducting qubit or the second superconducting qubit; increased speed of a quantum gate comprising the first superconducting qubit and the second superconducting qubit; or at least one of improved fidelity, improved accuracy, or improved performance of a quantum processor comprising the first superconducting qubit, the second superconducting qubit, and the superconducting bus resonator.

\* \* \* \* \*